United States Patent
Um et al.

(10) Patent No.: US 10,923,040 B2
(45) Date of Patent: Feb. 16, 2021

(54) GATE DRIVER AND ELECTROLUMINESCENT DISPLAY INCLUDING THE SAME

(71) Applicant: LG DISPLAY CO., LTD., Seoul (KR)

(72) Inventors: Hyunchul Um, Paju-si (KR); Eunkyung Seong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 103 days.

(21) Appl. No.: 16/131,723

(22) Filed: Sep. 14, 2018

(65) Prior Publication Data
US 2019/0130847 A1 May 2, 2019

(30) Foreign Application Priority Data
Oct. 31, 2017 (KR) .................. 10-2017-0143318

(51) Int. Cl.
*G09G 3/3291* (2016.01)
*G09G 3/3266* (2016.01)
*H01L 27/32* (2006.01)
*G11C 19/28* (2006.01)
*G09G 3/3233* (2016.01)

(52) U.S. Cl.
CPC ......... *G09G 3/3291* (2013.01); *G09G 3/3266* (2013.01); *G11C 19/28* (2013.01); *H01L 27/3276* (2013.01); *G09G 3/3233* (2013.01); *G09G 2300/0426* (2013.01); *G09G 2310/0286* (2013.01); *G09G 2310/08* (2013.01); *H01L 27/3262* (2013.01)

(58) Field of Classification Search
CPC combination set(s) only.
See application file for complete search history.

(56) References Cited

U.S. PATENT DOCUMENTS

| | | | | |
|---|---|---|---|---|
| 10,140,944 B2* | 11/2018 | Pyoun | .................. | G09G 3/3677 |
| 2004/0125069 A1* | 7/2004 | Park | ........................ | G11C 19/28 |
| | | | | 345/100 |
| 2006/0290390 A1* | 12/2006 | Jang | ........................ | G11C 19/28 |
| | | | | 327/112 |
| 2017/0116926 A1* | 4/2017 | Bong | .................... | G11C 19/186 |
| 2019/0066604 A1* | 2/2019 | Kong | ...................... | G11C 19/28 |

* cited by examiner

*Primary Examiner* — Van N Chow
(74) *Attorney, Agent, or Firm* — Birch, Stewart, Kolasch & Birch, LLP

(57) ABSTRACT

A gate driver can include a plurality of stages, each of the plurality of stages including a transistor T1 configured to apply a start signal of a gate-on voltage to a node Q in response to a clock signal and activate the node Q; a transistor T7 configured to supply an emission signal of the gate-on voltage to an output node when a node QA is bootstrapped in synchronization with a timing at which the node Q is activated; a QB controller configured to activate a node QB based on the clock signal, the start signal and a voltage of the node Q; and a transistor T8 configured to supply the emission signal of a gate-off voltage to the output node while the node QB is activated prior to activation of the node Q.

10 Claims, 34 Drawing Sheets

FIG. 11A

| Period | ① | ② | ③ | ④ |
|---|---|---|---|---|
| EVST | EVST High → T3 off | EVST High → T3 off | EVST High → T3 off | EVST High → T3 off |
| ECLK1 | ECLK1 High → T1 off | ECLK1 Low → T1 on | ECLK1 High → T1 off | ECLK1 Low → T1 on |
| ECLK2 | ECLK2 Low | ECLK2 High | ECLK2 Low | ECLK2 High |
| Q | Q node Low | Q node High | Q node High | Q node High |
| QA | QA node Very Low → T7 on | QA node High → T7 off | QA node High hold → T7 off | QA node High → T7 off |
| QB | QB node High hold → T8 off | QB node Low → T8 on | QB node Low hold → T8 on | QB node Low → T8 on |
| Q' | Q' node High hold → T2 off | Q' node Low (floating : Coupling) → T2 on | Q' node High → T2 off | Q' node Low (floating : Coupling) → T2 on |
| EM | EM(1) Low | EM(1) High | EM(1) High hold | EM(1) High hold |

FIG. 11B

| Period | ⑤ | ⑥ | ⑦ | ⑧ |
|---|---|---|---|---|
| EVST | EVST Low → T3 on | EVST Low → T3 on | EVST Low → T3 on | EVST Low → T3 on |
| ECLK1 | ECLK1 High → T1 off | ECLK1 Low → T1 on | ECLK1 High → T1 off | ECLK1 Low → T1 on |
| ECLK2 | ECLK2 Low | ECLK2 High | ECLK2 Low | ECLK2 High |
| Q | Q node High | Q node Low | Q node Low | Q node Low |
| QA | QA node High hold → T7 off | QA node Very Low (Bootstrapping) → T7 on | QA node Very Low hold → T7 on | QA node Very Low → T7 on |
| QB | QB node Low hold → T8 on | QB node High → T8 off | QB node High hold → T8 off | QB node High hold → T8 off |
| Q' | Q' node High → T2 off | Q' node High → T2 off | Q' node High → T2 off | Q' node High → T2 off |
| EM | EM(1) High hold | EM(1) Low | EM(1) Low hold | EM(1) Low hold |

FIG. 19A

| Period | ① | ② | ③ | ④ |
|---|---|---|---|---|
| EVST | EVST High → T3 off | EVST High → T3 off | EVST High → T3 off | EVST High → T3 off |
| ECLK1 | ECLK1 High → T1 off | ECLK1 Low → T1 on | ECLK1 High → T1 off | ECLK1 Low → T1 on |
| ECLK2 | ECLK2 Low | ECLK2 High | ECLK2 Low | ECLK2 High |
| Q | Q node Very Low | Q node High | Q node High | Q node High |
| QA | QA node Extreme Low → T7 on | QA node High → T7 off | QA node High hold → T7 off | QA node High → T7 off |
| QB | QB node High hold → T8 off | QB node Low → T8 on | QB node Low hold → T8 on | QB node Low → T8 on |
| Q' | Q' node High hold → T2 off | Q' node Low (floating : Coupling) → T2 on | Q' node High (floating : Coupling) → T2 off | Q' node Low (floating : Coupling) → T2 on |
| QA' | QA' node Low | QA' node High (floating : Bootstrapping) | QA' node High hold (floating) | QA' node High hold (floating) |
| EM | EM(1) Low | EM(1) High | EM(1) High hold | EM(1) High hold |

FIG. 19B

| Period | ⑤ | ⑥ | ⑦ | ⑧ |
|---|---|---|---|---|
| EVST | EVST Low → T3 on | EVST Low → T3 on | EVST Low → T3 on | EVST Low → T3 on |
| ECLK1 | ECLK1 High → T1 off | ECLK1 Low → T1 on | ECLK1 High → T1 off | ECLK1 Low → T1 on |
| ECLK2 | ECLK2 Low | ECLK2 High | ECLK2 Low | ECLK2 High |
| Q | Q node High | Q node Low | Q node Very Low | Q node Low |
| QA | QA node High hold → T7 off | QA node Low → T7 on | QA node Extreme Low (Bootstrapping) → T7 on | QA node Low → T7 on |
| QB | QB node Low hold → T8 on | QB node High → T8 off | QB node High hold → T8 off | QB node High hold → T8 off |
| Q' | Q' node High → T2 off | Q' node High → T2 off | Q' node High → T2 off | Q' node High → T2 off |
| QA' | QA' node High hold (floating) | QA' node High | QA' node Low | QA' node High |
| EM | EM(1) High hold | EM(1) Low | EM(1) Low hold | EM(1) Low hold |

GATE DRIVER AND ELECTROLUMINESCENT DISPLAY INCLUDING THE SAME

This application claims the priority benefit of Korean Patent Application No. 10-2017-0143318 filed in the Republic of Korea on Oct. 31, 2017, which is incorporated herein by reference for all purposes as if fully set forth herein.

BACKGROUND OF THE INVENTION

Field of the Invention

The present disclosure relates to a gate driver and an electroluminescent display including the same.

Discussion of the Related Art

An electroluminescent display can be classified into an inorganic electroluminescent display and an organic electroluminescent display depending on a material of an emission layer. An active matrix organic light emitting diode (OLED) display includes a plurality of OLEDs capable of emitting light by themselves and has many advantages including fast response time, high emission efficiency, high luminance, wide viewing angle, and the like.

An OLED display includes pixels arranged on a display panel in a matrix and adjusts a luminance of the pixels in accordance with gray levels of image data. Each pixel includes an OLED, a driving thin film transistor (TFT) controlling a driving current flowing in the OLED depending on a gate-to-source voltage of the driving TFT, and switching TFTs programming the gate-to-source voltage of the driving TFT in response to a scan signal. The pixel adjusts a display gray level (or a luminance) with an amount of light emitted by the OLED proportional to the driving current. Each pixel may further include an emission TFT that is turned on or off in response to an emission signal and determines emission timing of the OLED.

SUMMARY OF THE INVENTION

An organic electroluminescent display includes a gate driver generating a gate signal to be supplied to pixels. The gate driver can include a scan driver generating a scan signal and an emission driver generating an emission signal.

The scan driver can sequentially supply the scan signals to first gate lines connected to the pixels. Gate electrodes of switching thin film transistors (TFTs) included in the pixels can be connected to the scan driver through the first gate lines. The emission driver can sequentially supply the emission signals to second gate lines connected to the pixels. Gate electrodes of emission TFTs included in the pixels can be connected to the emission driver through the second gate lines.

The gate driver can be directly formed on a lower substrate of a display panel using a gate driver-in panel (GIP) manner. Namely, the gate driver can be formed in a non-display area (e.g., a bezel area) outside a screen of the display panel. An electroluminescent display has recently adopted a narrow bezel technology, which provides users with wider and larger images, by reducing left and right edges of a display panel on which an image is not displayed and increasing a size of a screen of the display panel on which the image is displayed. It is desirable for the electroluminescent display to maximally reduce a mounting area of a gate driver, in order to efficiently implement the narrow bezel technology.

Accordingly, the present disclosure provides a gate driver and an electroluminescent display including the same capable of reducing a mounting area of an emission driver by maximally simplifying the emission driver.

The present disclosure also provides a gate driver and an electroluminescent display including the same capable of reducing a mounting area of an emission driver by maximally simplifying the emission driver and capable of increasing reliability by securing operation stability.

In one aspect, there is provided a gate driver including a plurality of stages. Each of the plurality of stages includes a transistor T1 configured to apply a start signal of a gate-on voltage to a node Q in response to a clock signal and activate the node Q, a first transistor (T7) configured to supply an emission signal of the gate-on voltage to an output node from when a node QA is bootstrapped in synchronization with a timing at which the node Q is activated, a QB controller configured to activate a node QB as opposed to the node Q in response to the clock signal, the start signal, and a voltage of the node Q, and a second transistor (T8) configured to supply the emission signal of a gate-off voltage to the output node while the node QB is activated prior to the node Q.

BRIEF DESCRIPTION OF THE DRAWINGS

The accompanying drawings are included to provide a further understanding of the disclosure and are incorporated in and constitute a part of this specification, illustrate embodiments of the disclosure, and together with the description serve to explain various principles of the disclosure.

FIG. 11A is a table illustrating operations of a stage corresponding to periods ① to ④ shown in FIG. 9 according to an embodiment of the disclosure.

FIG. 11B is a table illustrating operations of a stage corresponding to periods ⑤ to ⑧ shown in FIG. 9 according to an embodiment of the disclosure.

FIG. 19A is a table illustrating operations of a stage corresponding to periods ① to ④ shown in FIG. 17 according to an embodiment of the disclosure.

FIG. 19B is a table illustrating operations of a stage corresponding to periods ⑤ to ⑧ shown in FIG. 17 according to an embodiment of the disclosure.

DETAILED DESCRIPTION OF THE EMBODIMENTS

Figure 1:
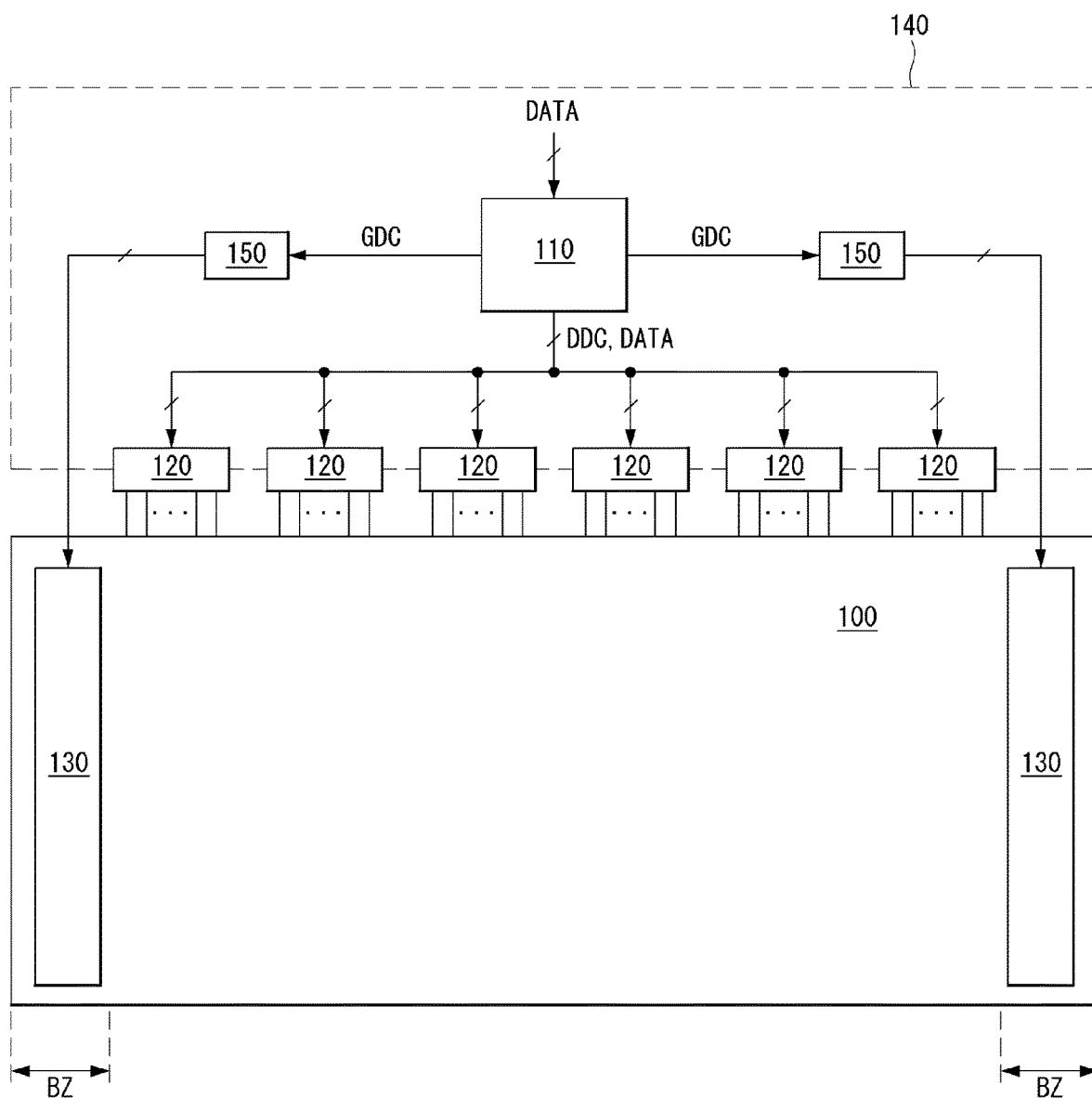
FIG. 1 illustrates a display device according to an embodiment of the disclosure.

Reference will now be made in detail to embodiments of the disclosure, examples of which are illustrated in the accompanying drawings. However, the present disclosure is not limited to embodiments disclosed below, and can be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings illustrating embodiments of the disclosure are merely exemplary, and the present disclosure is not limited thereto unless specified as such. Like reference numerals designate like elements throughout. In the following description, when a detailed description of certain functions or configurations related to this document that may unnecessarily cloud the gist of the invention have been omitted.

In the present disclosure, when the terms "include," "have," "comprised of," etc. are used, other components may be added unless "only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above," "under or below," "next to" another structure, this description should be construed as including a situation in which the structures directly contact each other as well as a situation in which a third structure is disposed therebetween.

The terms "first," "second," etc. may be used to describe various components, but the components are not limited by such terms. The terms are used only for the purpose of distinguishing one component from other components. For example, a first component may be designated as a second component, and vice versa, without departing from the scope of the present disclosure.

In embodiments disclosed herein, each of a pixel circuit and a gate driver on a substrate of a display panel can be implemented as transistors of p-type metal oxide semiconductor field effect transistor (MOSFET) structure. However, embodiments are not limited thereto. The transistor is a three-electrode element including a gate, a source, and a drain. The source is an electrode for supplying carriers to the transistor. The carriers inside the transistor begin to flow from the source. The drain is an electrode from which the carriers exit the transistor. Namely, carriers in the MOSFET flow from the source to the drain. In a situation of a p-type thin film transistor (TFT) (or p-type MOSFET (PMOS)), because carriers are holes, a source voltage is greater than a drain voltage so that holes can flow from a source to a drain. In the p-type TFT, because holes flow from the source to the drain, a current flows from the source to the drain. It should be noted that the source and the drain of the MOSFET are not fixed. For example, the source and the drain of the MOSFET may be changed depending on an applied voltage. Thus, in embodiments disclosed herein, one of the source and the drain is referred to as a first electrode, and the other is referred to as a second electrode.

The following embodiments are described using an organic electroluminescent display including an organic light emitting material as an example of an electroluminescent display. However, embodiments are not limited to the organic electroluminescent display. For example, embodiments of the disclosure can be applied to an inorganic electroluminescent display including an inorganic electroluminescent material.

Figure 2:
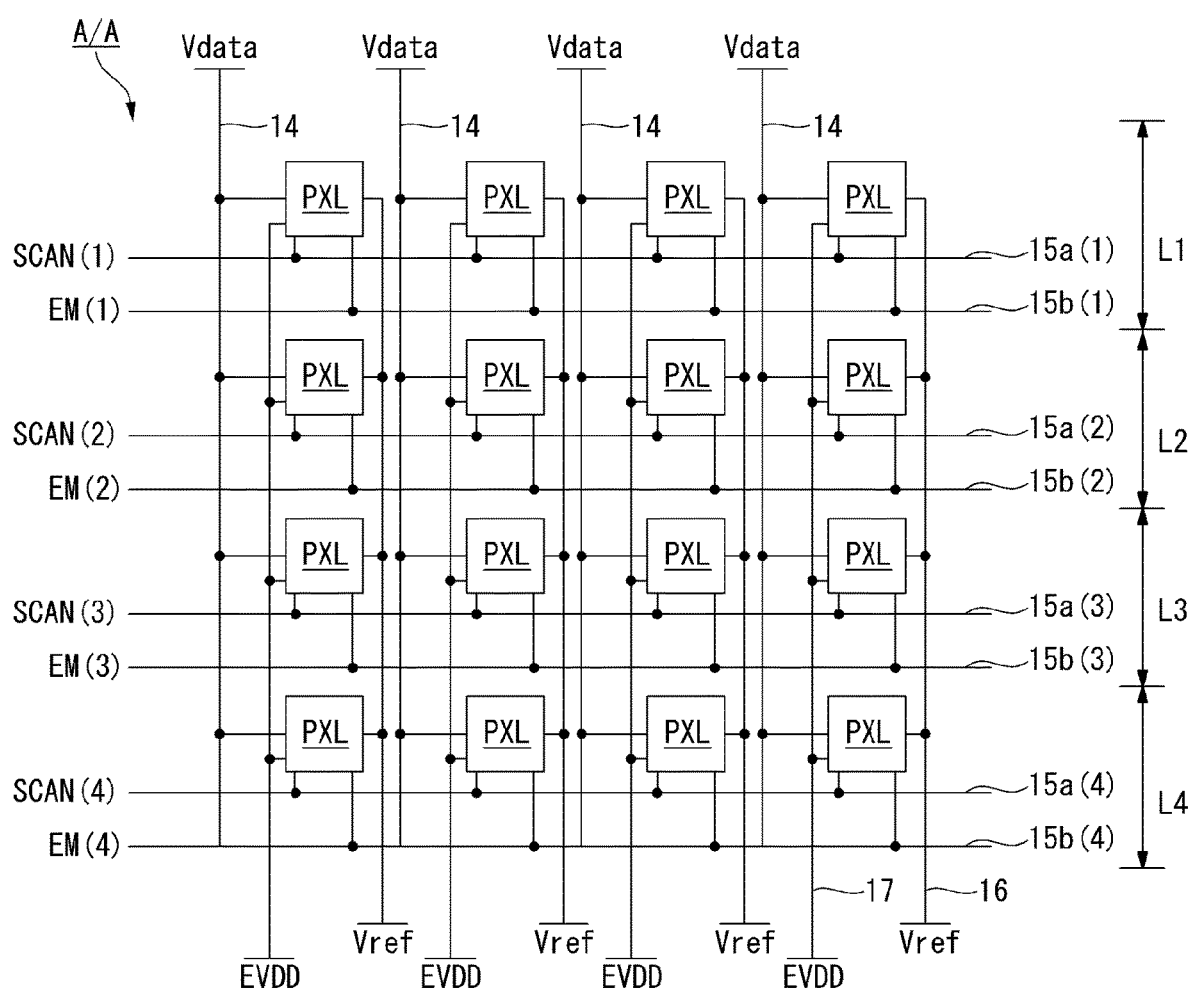
FIG. 2 illustrates a pixel array included in a display panel shown in FIG. 1 according to an embodiment of the disclosure.
Figure 3:
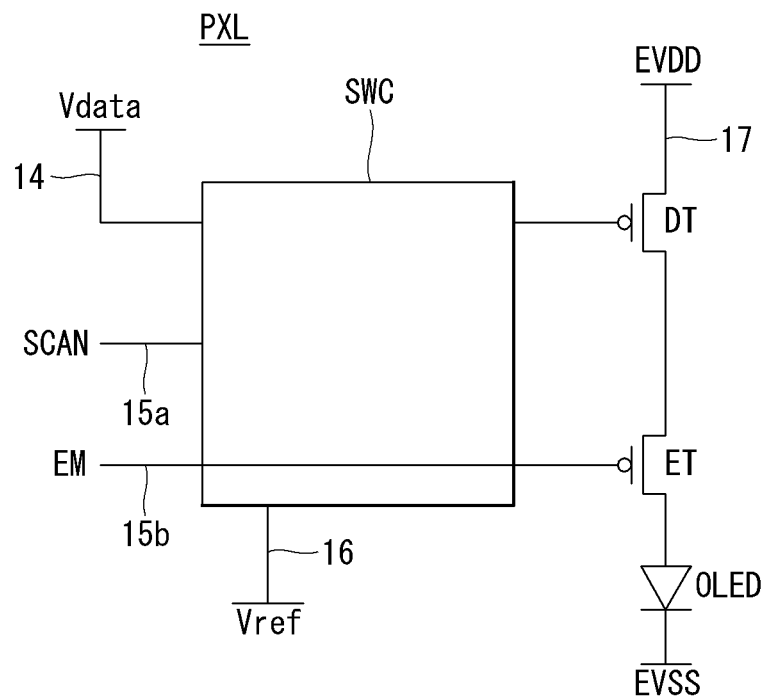
FIG. 3 schematically illustrates a pixel circuit included in a pixel array shown in FIG. 2 according to an embodiment of the disclosure.
Figure 4:
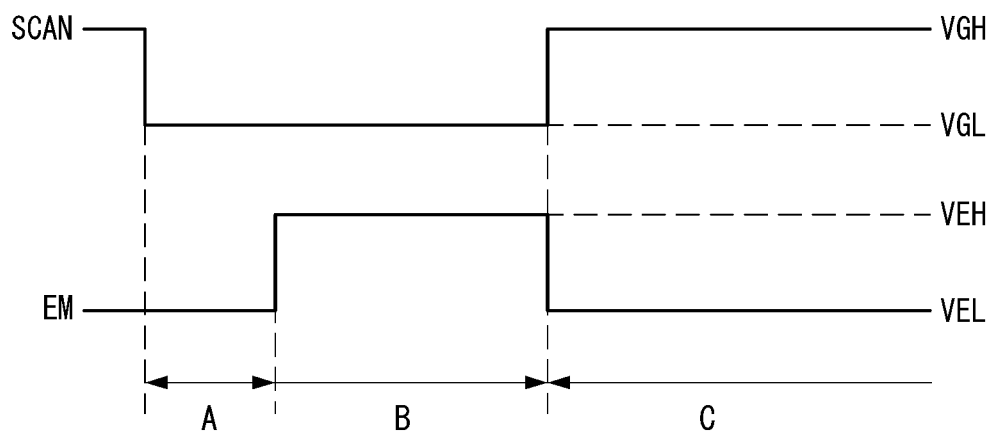
FIG. 4 illustrates a gate signal applied to a pixel circuit shown in FIG. 3 according to an embodiment of the disclosure.
Figure 5:
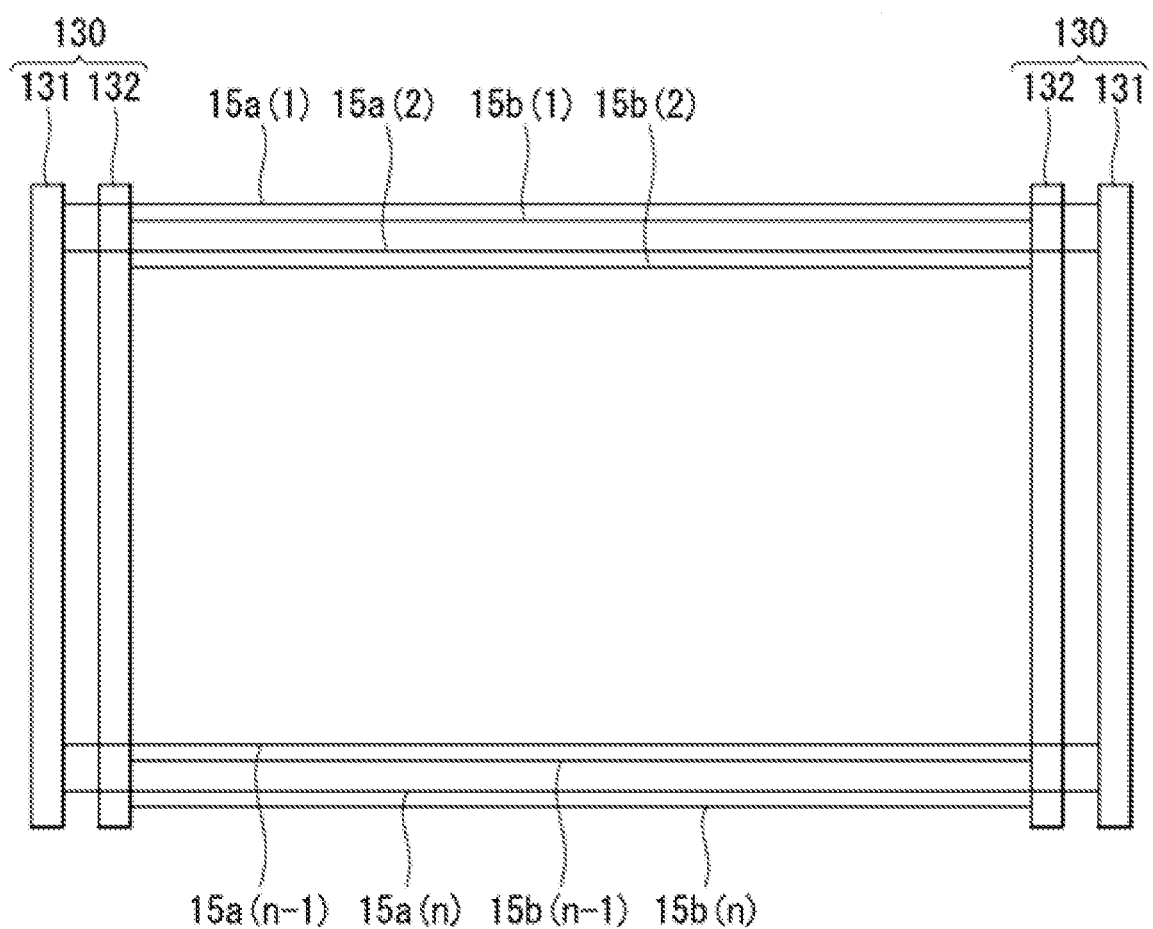
FIG. 5 illustrates a scan driver and an emission driver included in a gate driver shown in FIG. 1 according to an embodiment of the disclosure.

FIG. 1 illustrates a display device according to an embodiment of the disclosure. FIG. 2 illustrates a pixel array included in a display panel shown in FIG. 1. FIG. 3 schematically illustrates a pixel circuit included in a pixel array shown in FIG. 2. FIG. 4 illustrates a gate signal applied to a pixel circuit shown in FIG. 3. FIG. 5 illustrates a scan driver and an emission driver included in a gate driver shown in FIG. 1.

Referring to FIG. 1, a display device according to an embodiment of the disclosure includes a display panel 100, a timing controller 110, a data driver 120, a gate driver 130, and a level shifter 150, and the like.

A plurality of data lines 14 and a plurality of gate lines 15a and 15b are disposed to intersect each other on the display panel 100. Pixels PXL are respectively arranged at intersections of the data lines 14 and the gate lines 15a and 15b in a matrix to form a pixel array. The pixels PXL can be arranged in various forms in addition to the matrix form.

As shown in FIG. 2, the pixel array is included in an active area A/A of the display panel 100. The pixel array includes a plurality of horizontal pixel lines L1 to L4. The pixels PXL, which are horizontally adjacent to one another and are commonly connected to the gate lines 15a and 15b, are disposed on each of the horizontal pixel lines L1 to L4. In embodiments disclosed herein, each of the horizontal pixel lines L1 to L4 is not a physical signal line, but rather a set of pixels implemented by horizontally adjacent pixels PXL of one line. The pixel array can include first power lines 16 supplying a reference voltage Vref to the pixels PXL and second power lines 17 supplying a high potential power voltage EVDD to the pixels PXL. Further, the pixels PXL can be connected to an input terminal of a low potential power voltage EVSS.

Configuration of the gate lines 15a and 15b can vary depending on a pixel circuit. For example, as shown in FIG. 2, each gate line can include a first gate line 15a supplied with a scan signal SCAN and a second gate line 15b supplied with an emission signal EM.

Each pixel PXL can be one of a red pixel, a green pixel, a blue pixel, and a white pixel. A red pixel, a green pixel, a blue pixel, and a white pixel can constitute a unit pixel, in order to implement various colors. A color implemented by the unit pixel can be determined depending on an emission rate of the red pixel, the green pixel, the blue pixel, and the white pixel. The white pixel may be omitted, if necessary or desired. Each pixel PXL can be connected to the data line 14, the first gate line 15a, the second gate line 15b, the first power line 16, the second power line 17, and the like.

The pixel circuit can have various configurations. For example, as shown in FIG. 3, each pixel PXL can include an organic light emitting diode (OLED), a driving thin film transistor (TFT) DT controlling a driving current flowing in the OLED depending on a gate-to-source voltage of the driving TFT DT, a switch circuit SWC for programming the gate-to-source voltage of the driving TFT DT, and an emission TFT ET that is turned on or off in response to the emission signal EM and determines emission timing of the OLED. The switch circuit SWC can include a plurality of switching TFTs, one or more capacitors, and the like. The switch circuit SWC can be variously modified according to model and specification of the product. The TFTs included in each pixel PXL can be implemented as PMOS low-temperature polycrystalline silicon (LTPS) TFTs, and thus each pixel PXL can secure desired response characteristics through the PMOS LTPS TFTs. However, embodiments are not limited thereto. For example, at least one of the TFTs can be implemented as an NMOS oxide TFT having good off-current characteristics, and other TFTs can be implemented as PMOS LTPS TFTs having good response characteristics.

Each pixel PXL can be driven in response to a gate signal shown in FIG. 4. Each pixel PXL may perform an initialization operation, a programming operation, and an emission operation in response to a scan signal SCAN and an emission signal EM shown in FIG. 4. In an initialization period A, the switch circuit SWC can initialize specific nodes of the pixel circuit to the reference voltage Vref. In a programming period B, the switch circuit SWC can program the gate-to-source voltage of the driving TFT DT based on a data voltage Vdata. In the programming period B, change in a threshold voltage of the driving TFT DT can be sampled and compensated. In an emission period C, a driving current corresponding to the gate-to-source voltage flows between a source and a drain of the driving TFT DT, and the OLED emits light with the driving current.

The emission TFT ET can be turned on in the initialization period A and the emission period C in response to the emission signal EM and can be turned off in the programming period B in response to the emission signal EM. The emission signal EM can be variously modified depending on a structure of the pixels. In this instance, the emission TFT ET can be turned on in the emission period C and can be turned off in the remaining periods.

In FIG. 4, a gate-on voltage is a voltage of the gate signal capable of turning on the TFT, and a gate-off voltage is a voltage of the gate signal capable of turning off the TFT. For example, a gate-on voltage in the PMOS is gate low voltages VGL and VEL, and a gate-off voltage in the PMOS is gate high voltages VGH and VEH higher than the gate low voltages VGL and VEL.

Referring to FIG. 1, the data driver 120 receives image data DATA from the timing controller 110. The data driver 120 converts the image data DATA into gamma compensation voltages in response to a source timing control signal DDC received from the timing controller 110 and generates data voltages Vdata. The data driver 120 synchronizes the data voltage Vdata with the scan signal SCAN and supplies the data voltage Vdata to the data lines 14 of the display panel 100. The data driver 120 can be connected to the data lines 14 of the display panel 100 through a chip-on glass (COG) process or a tape automated bonding (TAB) process.

Referring to FIG. 1, the level shifter 150 boosts a transistor-transistor logic (TTL) level voltage of a gate timing control signal GDC received from the timing controller 110 to the gate-off voltage and the gate-on voltage capable of driving the TFTs of the display panel 100 and supplies them to the gate driver 130. The gate timing control signal GDC can include an external start signal, a clock signal, and the like.

Referring to FIG. 1, the gate driver 130 operates in response to the gate timing control signal GDC received from the level shifter 150 and generates the gate signals. The gate driver 130 sequentially supplies the gate signals to the gate lines. The gate driver 130 can be directly formed on a lower substrate of the display panel 100 using a gate driver-in panel (GIP) manner. The gate driver 130 is formed in a non-display area (e.g., a bezel area BZ) outside the active area A/A of the display panel 100. In the GIP manner, the level shifter 150 can be mounted on a printed circuit board (PCB) 140 together with the timing controller 110.

As shown in FIG. 5, the gate drivers 130 are disposed on opposite sides of the display panel 100 in a double bank structure and can reduce signal distortion resulting from a load deviation depending on a position. The gate driver 130 includes a scan driver 131 generating the scan signal SCAN and an emission driver 132 generating the emission signal EM.

The scan driver 131 can supply the scan signals SCAN to first gate lines 15a(1) to 15a(n) connected to the pixels PXL in a line sequential manner. The emission driver 132 can supply the emission signals EM to second gate lines 15b(1) to 15b(n) connected to the pixels PXL in a line sequential manner. The emission driver 132 can be implemented as a gate shift register including a plurality of stages. Each stage of the emission driver 132 can be implemented as shown in FIGS. 6 to 11B, in order to reduce the bezel area BZ of the display panel 100. Each stage of the emission driver 132 can be implemented as shown in FIGS. 14 to 19B, in order to reduce the bezel area BZ of the display panel 100 and secure stability and reliability of an operation even when the display panel 100 has a freeform portion, for example, a partial curved portion or a notch.

Referring to FIG. 1, the timing controller 110 can be connected to an external host system through known various interface manners. The timing controller 110 receives the image data DATA from the host system. The timing controller 110 can correct the image data DATA and then transmit the corrected image data DATA to the data drivers 120, so that a luminance variation resulting from a difference between driving characteristics of the pixels PXL is compensated. FIG. 1 illustrates the plurality of data drivers 120, by way of example. However, embodiments are not limited thereto. For example, one data driver can be used. In addition, one data driver can be integrated with the timing controller 110 and can be mounted on the display panel 100.

The timing controller 110 receives timing signals, such as a vertical sync signal Vsync, a horizontal sync signal Hsync, a data enable signal DE, and a main clock MCLK from the host system. The timing controller 110 can generate the gate timing control signal GDC and the source timing control signal DDC based on the timing signals.

Figure 6:
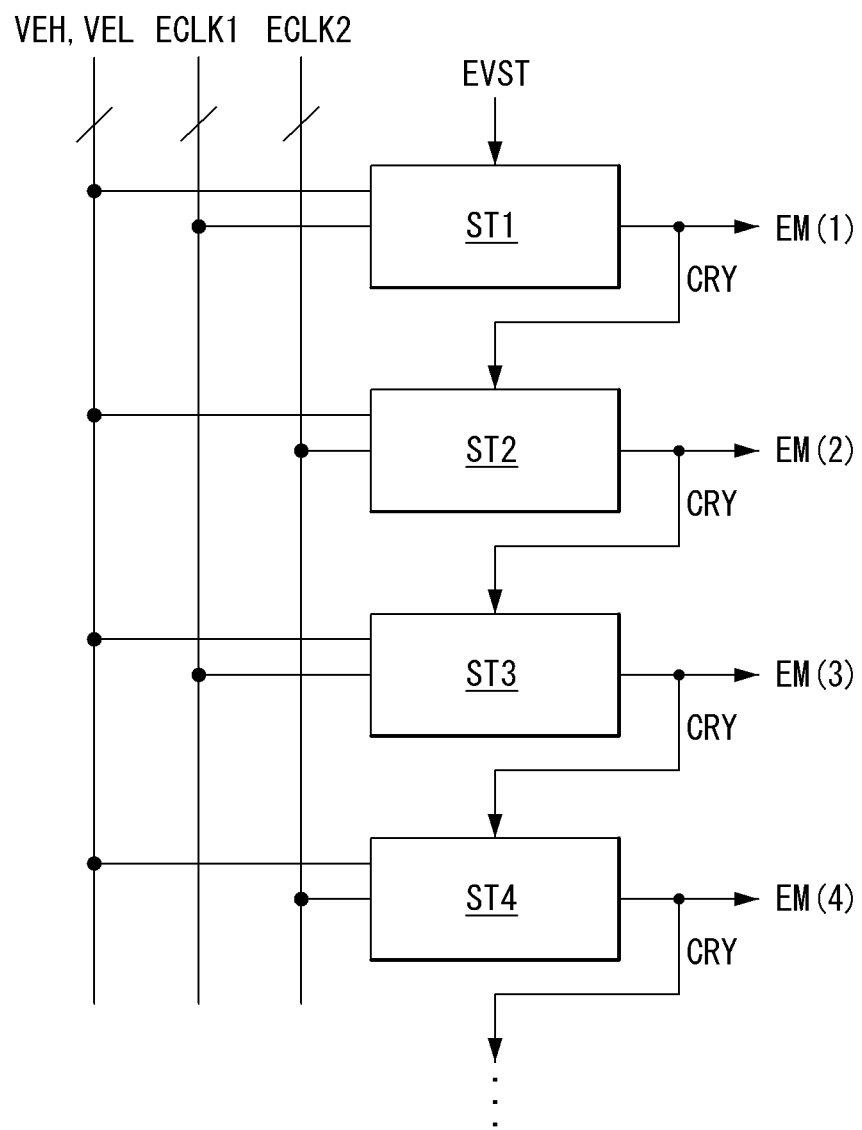
FIG. 6 illustrates configuration of a gate shift register included in an emission driver shown in FIG. 5 according to an embodiment of the disclosure.

FIG. 6 illustrates configuration of a gate shift register included in the emission driver shown in FIG. 5.

Referring to FIG. 6, the emission driver 132 according to the embodiment of the disclosure can be implemented as a gate shift register including a plurality of stages ST1 to ST4, . . . . The stages ST1 to ST4, . . . can be GIP elements formed in the GIP manner.

Operations of the stages ST1 to ST4, . . . are sequentially activated in response to a start signal and output emission signals EM(1) to EM(4), . . . . An operation of the uppermost stage ST1 is activated in response to an external start signal EVST, and operations of the second uppermost stage ST2 below the uppermost stage ST1 to a lowermost stage are activated in response to an emission signal of a previous stage. The emission signal of the previous stage is used as an internal start signal and is a carry signal CRY. In embodiments disclosed herein, "previous stage" is a stage that is activated earlier than a reference stage and generates an emission signal of which a phase is earlier than a phase of an emission signal output from the reference stage.

The stages ST1 to ST4, . . . receive the external start signal EVST, a first clock signal ECLK1, and a second clock signal ECLK2 from the level shifter 150 in order to output the emission signals EM(1) to EM(4), . . . . The external start signal EVST, the first clock signal ECLK1, and the second clock signal ECLK2 may swing between the gate-off voltage VEH and the gate-on voltage VEL.

The external start signal EVST is input to the uppermost stage ST1. The first clock signal ECLK1 is input to the odd-numbered stages ST1, ST3, . . . through first clock lines, and the second clock signal ECLK2 is input to the even-numbered stages ST2, ST4, . . . through second clock lines. The first clock signal ECLK1 and the second clock signal ECLK2 each have a different phase.

Because each of the stages ST1 to ST4, . . . operates based on one clock signal, circuit configuration of each sage is simple. In other words, each of the stages ST1 to ST4, . . . has a circuit structure capable of activating a node Q and at the same time bootstrapping a node QA based on one clock signal, and thus can simplify the emission driver and reduce a mounting area of the emission driver.

Each of the stages ST1 to ST4, . . . activates an operation of the node Q in response to a start signal applied to a start terminal in each frame. In embodiments disclosed herein, the fact that a node is activated indicates that the gate-on voltage VEL or a voltage corresponding to the gate-on voltage VEL is applied to the node. Further, the fact that a node is deactivated indicates that the gate-off voltage VEH or a voltage corresponding to the gate-off voltage VEH is applied to the node.

Each of the stages ST1 to ST4, . . . receives the gate-off voltage VEH and the gate-on voltage VEL from an external power supply unit. For example, the gate-off voltage VEH can be set to 20V to 30V, and the gate-on voltage VEL can be set to −10V to 0V. However, embodiments are not limited thereto.

Figure 7:
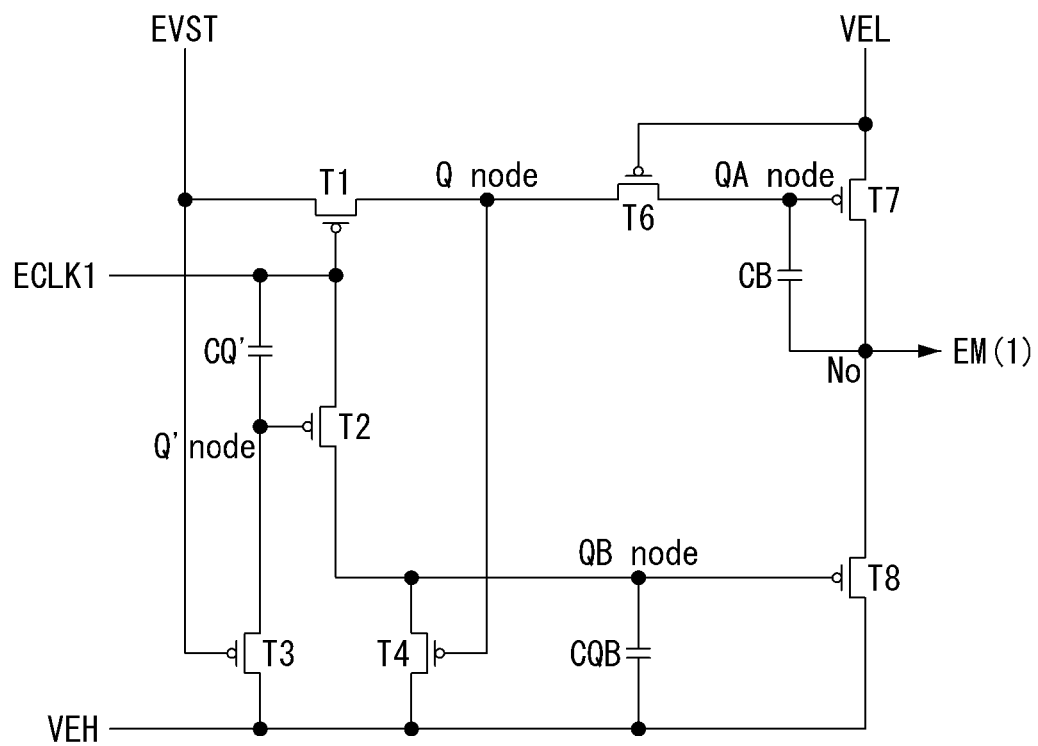
FIG. 7 illustrates configuration of an uppermost stage included in a gate shift register shown in FIG. 6 according to an embodiment of the disclosure.
Figure 8:
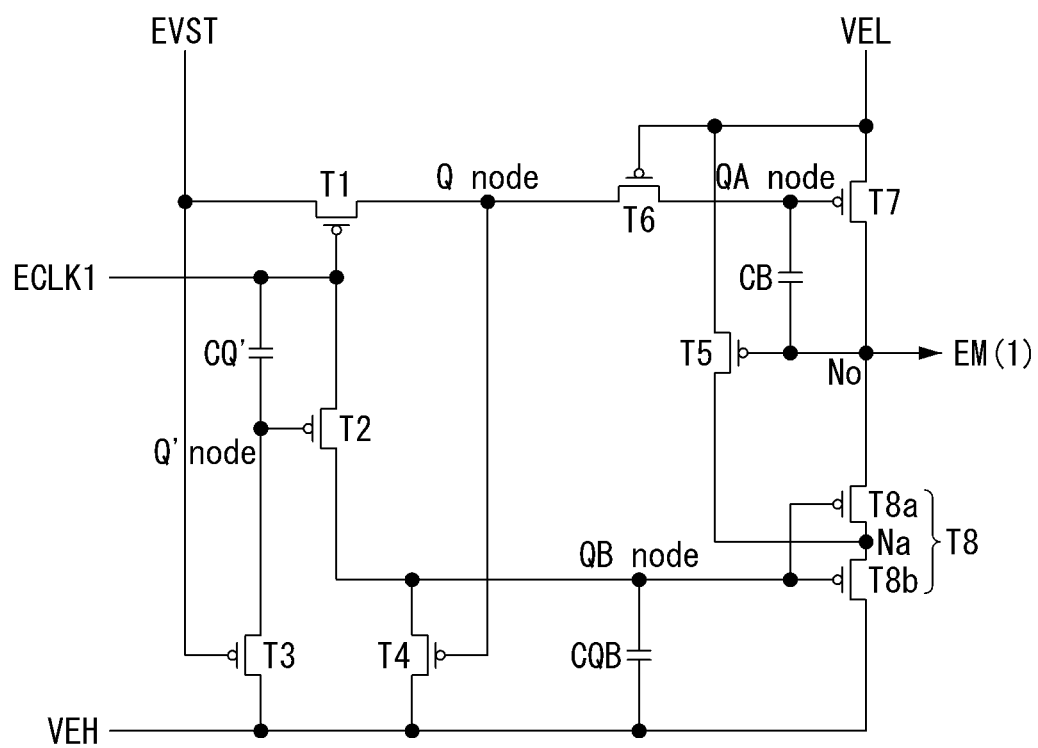
FIG. 8 illustrates another configuration of an uppermost stage included in a gate shift register shown in FIG. 6 according to an embodiment of the disclosure.

FIG. 7 illustrates configuration of an uppermost stage ST1 included in the gate shift register shown in FIG. 6. FIG. 8 illustrates another configuration of the uppermost stage ST1 included in the gate shift register shown in FIG. 6.

Configurations of the remaining odd-numbered stages except the uppermost stage ST1 are substantially the same as configuration of the uppermost stage ST1, except that they receive the internal start signal CRY instead of the external start signal EVST and output an emission signal having a different phase from the uppermost stage ST1. Further, configurations of the even-numbered stages are substantially the same as configuration of the uppermost stage ST1, except that they receive the internal start signal CRY instead of the external start signal EVST, receive the second clock signal ECLK2 instead of the first clock signal ECLK1, and output an emission signal having a different phase from the uppermost stage ST1.

Referring to FIG. 7, a stage ST1 outputs an emission signal EM(1) of the gate-off voltage VEH while the node Q is deactivated to the gate-off voltage VEH and a node QB is activated to the gate-on voltage VEL. Subsequently, the stage ST1 outputs the emission signal EM(1) of the gate-on voltage VEL while the node Q is activated to the gate-on voltage VEL and the node QB is deactivated to the gate-off voltage VEH. In other words, the stage ST1 outputs the emission signal EM(1) of the gate-on voltage VEL from when the node QA is bootstrapped in synchronization with timing at which the node Q is activated.

Thus, the stage ST1 can include a Q controller, a QB controller, an output unit, and a first stabilization unit.

The Q controller can be implemented as a transistor T1. The transistor T1 applies the external start signal EVST of the gate-on voltage VEL to the node Q in response to the first clock signal ECLK1 and activates the node Q. A gate electrode of the transistor T1 is connected to an input terminal of the first clock signal ECLK1, and a first electrode and a second electrode of the transistor T1 are connected to an input terminal of the external start signal EVST and the node Q, respectively.

The QB controller activates the node QB as opposed to the node Q in response to the first clock signal ECLK1, the start external signal EVST, and a voltage of the node Q. The QB controller can include a capacitor CQ', a transistor T2, a transistor T3, a transistor T4, and a capacitor CQB.

The capacitor CQ' is connected between the input terminal of the first clock signal ECLK1 and a node Q'. The transistor T2 supplies the first clock signal ECLK1 to the node QB in accordance with a voltage of the node Q'. A gate electrode of the transistor T2 is connected to the node Q', and a first electrode and a second electrode of the transistor T2 are connected to the input terminal of the first clock signal ECLK1 and the node QB, respectively. The transistor T3 supplies the gate-off voltage VEH to the node Q' in response to the external start signal EVST. A gate electrode of the transistor T3 is connected to the input terminal of the external start signal EVST, and a first electrode and a second electrode of the transistor T3 are connected to the node Q' and an input terminal of the gate-off voltage VEH, respectively. According to the above-described configuration, the voltage of the node Q' changes in synchronization with the first clock signal ECLK1 while the external start signal EVST is held at the gate-off voltage VEH. Further, the voltage of the node Q' becomes the gate-off voltage VEH while the external start signal EVST is held at the gate-on voltage VEL.

The transistor T4 supplies the gate-off voltage VEH to the node QB in accordance with the voltage of the node Q. A gate electrode of the transistor T4 is connected to the node Q, and a first electrode and a second electrode of the transistor T4 are connected to the node QB and the input terminal of the gate-off voltage VEH, respectively. The capacitor CQB is connected between the node QB and the input terminal of the gate-off voltage VEH to stabilize the voltage of the node QB.

The output unit includes a transistor T7 serving as a pull-down element, a transistor T8 serving as a pull-up element, and a capacitor CB.

The transistor T7 supplies the emission signal EM (1) of the gate-on voltage VEL to an output node No from when the node QA is bootstrapped in synchronization with a timing at which the node Q is activated. A gate electrode of the transistor T7 is connected to the node QA, and a first electrode and a second electrode of the transistor T7 are connected to an input terminal of the gate-on voltage VEL and the output node No, respectively. The capacitor CB is connected between the node QA and the output node No. When the emission signal EM(1) changes from the gate-off voltage VEH to the gate-on voltage VEL, the capacitor CB reflects a change in a voltage of the output node No to a voltage of the node QA to thereby function to bootstrap the node QA. The transistor T8 supplies the emission signal EM(1) of the gate-off voltage VEH to the output node No while the node QB is activated prior to the node Q. A gate electrode of the transistor T8 is connected to the node QB, and a first electrode and a second electrode of the transistor T8 are connected to the output node No and the input terminal of the gate-off voltage VEH, respectively.

The first stabilization unit can be implemented as a transistor T6. A gate electrode of the transistor T6 is connected to the input terminal of the gate-on voltage VEL, and a first electrode and a second electrode of the transistor T6 are connected to the node Q and the node QA, respectively. When the node QA is bootstrapped, a channel current between the first electrode and the second electrode of the transistor T6 becomes zero. In other words, when the node QA is bootstrapped, the transistor T6 is turned off to thereby block an electrical connection between the node Q and the node QA. Further, the transistor T6 maintains a turn-on state while the node QA is not bootstrapped.

The transistor T6 maintains the turn-on state and is turned off only when the node QA is bootstrapped, thereby blocking a current from flowing between the node Q and the node QA. Thus, when the node QA is bootstrapped, the voltage of the node Q is different from the voltage of the node QA. Even when the voltage of the node QA changes at the moment when the node QA is bootstrapped, the voltage of the node Q does not change. Therefore, the transistors T1 and T4 connected to the node Q are not overloaded at the moment when the node QA is bootstrapped. If there is no transistor T6, a drain-to-source voltage Vds of the transistor T1 and a gate-to-source voltage Vgs of the transistor T4 may increase to a voltage level equal to or greater than a critical value due to the bootstrapping. If such an overload phenomenon continues, a device breakdown phenomenon, so-called, a breakdown phenomenon may occur. The transistor T6 can prevent the transistors T1 and T4 connected to the node Q from breaking down at the moment when the node QA is bootstrapped.

A circuit of FIG. 8 constituting the stage ST1 is different from the circuit of FIG. 7, in that a transistor T8 is configured in a dual gate structure, and a transistor T5 is added. The circuit of FIG. 8 has an advantage that it is easier to suppress a leakage current of a pull-up element than the circuit of FIG. 7.

Referring to FIG. 8, a transistor T8 can include a transistor T8a and a transistor T8b that are connected in series with each other. A gate electrode of the transistor T8a is connected to the node QB, a first electrode of the transistor T8a is connected to the output node No, and a second electrode of the transistor T8a is connected to a node Na. A gate electrode of the transistor T8b is connected to the node QB, a first electrode of the transistor T8b is connected to the node Na, and a second electrode of the transistor T8b is connected to the input terminal of the gate-off voltage VEH.

A gate electrode of the transistor T5 is connected to the output node No, a first electrode of the transistor T5 is connected to the input terminal of the gate-on voltage VEL, and a second electrode of the transistor T5 is connected to the node Na.

The emission signal EM(1) output from the stage ST1 is held at the gate-on voltage VEL during most of one frame period. Thus, the voltage of the output node No is held at the gate-on voltage VEL during most of one frame period.

When the transistor T8 of FIG. 7 is used, there is a large difference (e.g., a difference between the voltages VEH and VEL) between a drain voltage and a source voltage of the transistor T8 when the voltage of the output node No holds the gate-on voltage VEL. When the large voltage difference lasts for a long time, the transistor T8 is easily deteriorated. When a leakage current flows in the transistor T8 due to the deterioration of the transistor T8, the normal emission signal EM(1) cannot be output.

On the contrary, when the transistor T8 having the dual gate structure of FIG. 8 is used, the gate-on voltage VEL is applied to the node Na through the transistor T5 while the voltage of the output node No holds the gate-on voltage VEL. Therefore, a difference (e.g., a difference between the voltages VEL and VEL) between a drain voltage and a source voltage of the transistor T8 is ideally zero. Thus, deterioration of the transistor T8 is prevented. Even when the transistor T8b is deteriorated while the voltage of the output node No holds the gate-on voltage VEL, and a leakage current flows in the transistor T8b, the transistor T8a can suppress a flow of the leakage current.

Figure 9:
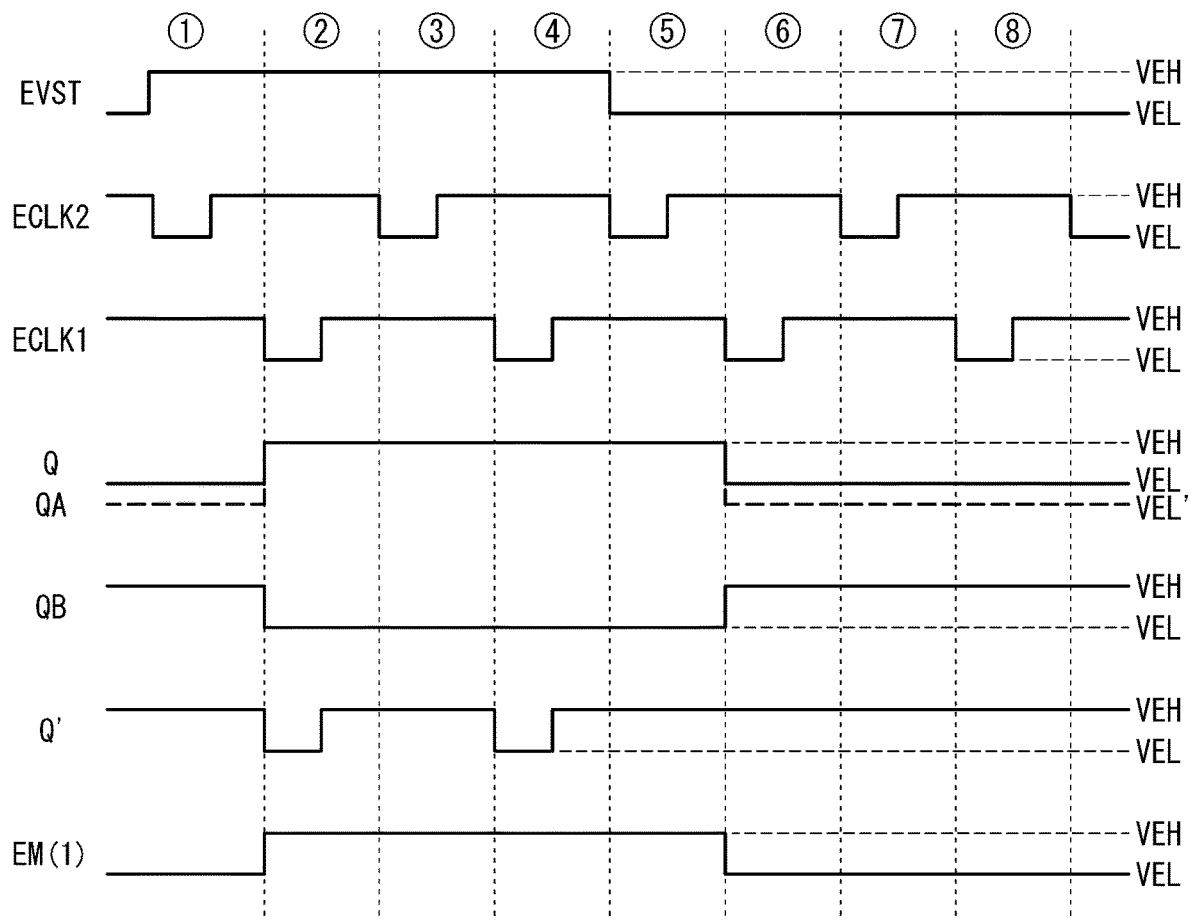
FIG. 9 illustrates an operation waveform of a stage shown in FIG. 8 according to an embodiment of the disclosure.

FIG. 9 illustrates an operation waveform of a stage shown in FIG. 8. FIGS. 10A to 10H illustrate operation states of a stage respectively corresponding to periods ① to ⑧ shown in FIG. 9.

Figure 10A:
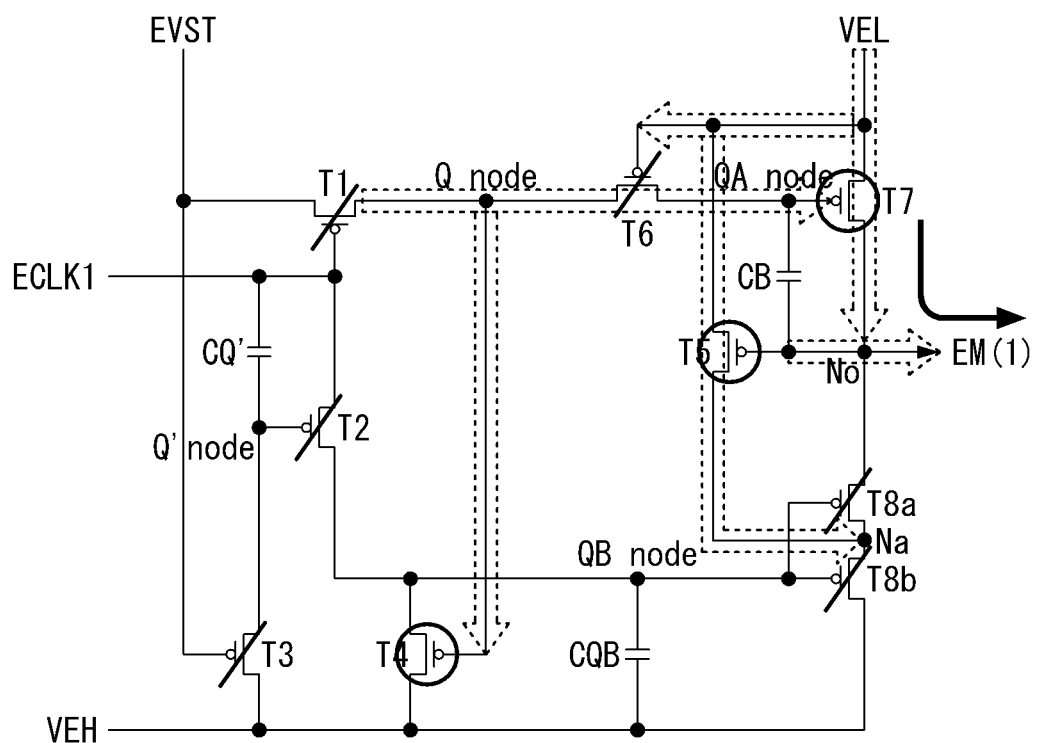
FIGS. 10A to 10H illustrate operation states of a stage respectively corresponding to periods ① to ② shown in FIG. 9 according to an embodiment of the disclosure.

Referring to FIGS. 9 and 10A, in a period ①, the external start signal EVST and the first clock signal ECLK1 are input at the gate-off voltage VEH, and the second clock signal ECLK2 is input at the gate-on voltage VEL for a predetermined time.

In the period ①, the transistor T1 is turned off in response to the first clock signal ECLK1 of the gate-off voltage VEH, and the transistor T3 is turned off in response to the external start signal EVST of the gate-off voltage VEH. Further, the transistor T2 is turned off by the gate-off voltage VEH of the node Q'.

In the period ①, the node Q holds the gate-on voltage VEL of a previous frame, and the node QA holds a boosting voltage VEL' of the previous frame. The boosting voltage VEL' may be less than the gate-on voltage VEL. The transistor T7 is turned on by the boosting voltage VEL' of the node QA, and the emission signal EM(1) of the gate-on voltage VEL is output to the output node No.

In the period ①, the transistor T4 is turned on by the gate-on voltage VEL of the node Q, and the gate-off voltage VEH is applied to the node QB. Further, the transistors T8a and T8b are turned off by the gate-off voltage VEH of the node QB. The transistor T5 is turned on by the gate-on voltage VEL of the output node No and applies the gate-on voltage VEL to the node Na, thereby preventing the deterioration of the transistor T8a.

In the period ①, a channel current does not flow in the transistor T6 due to the bootstrapping of the node QA, and the transistor T6 is in a substantial turn-off state.

Figure 10B:
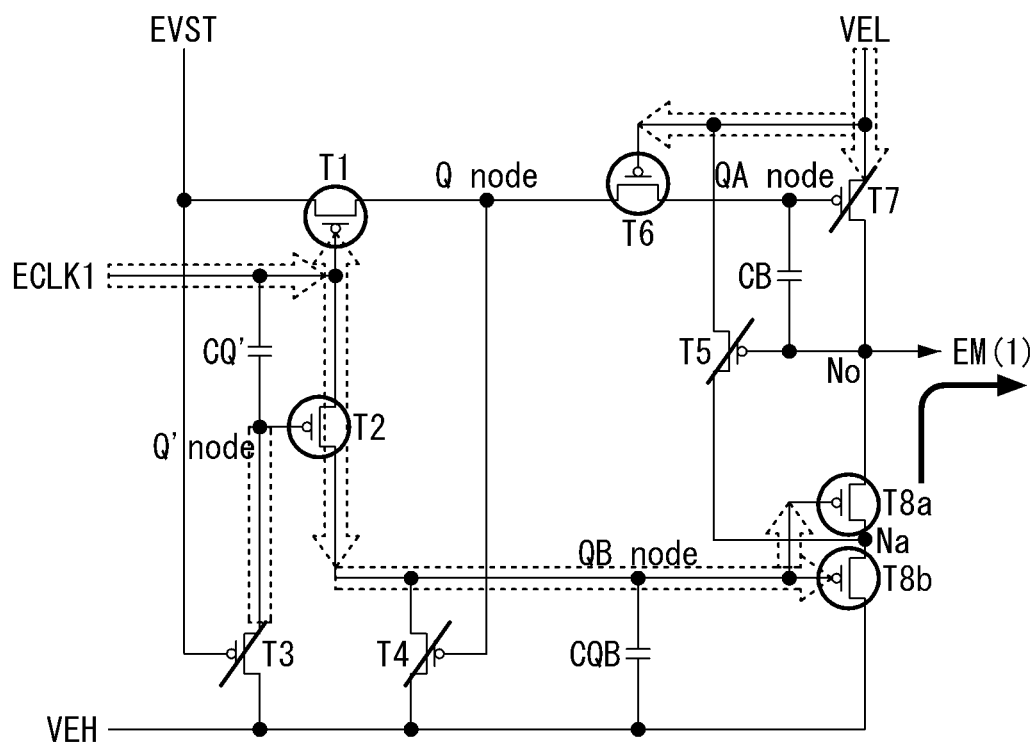

Referring to FIGS. 9 and 10B, in a period ②, the external start signal EVST and the second clock signal ECLK2 are input at the gate-off voltage VEH, and the first clock signal ECLK1 is input at the gate-on voltage VEL for a predetermined time.

In the period ②, the transistor T1 is turned on in response to the first clock signal ECLK1 of the gate-on voltage VEL, and the transistor T3 maintains an off-state in response to the external start signal EVST of the gate-off voltage VEH. Further, the node Q' is coupled to the first clock signal ECLK1 of the gate-on voltage VEL, and thus the voltage of the node Q' is changed to the gate-on voltage VEL. Hence, the node Q' turns on the transistor T2.

In the period ②, the external start signal EVST of the gate-off voltage VEH is applied to the node Q through the transistor T1. The gate-off voltage VEH of the node Q is applied to the node QA through the transistor T6 and turns off the transistor T7.

In the period ②, the transistor T4 is turned off by the gate-off voltage VEH of the node Q, and the first clock signal ECLK1 of the gate-on voltage VEL is applied to the node QB through the transistor T2. Thus, the transistors T8a and T8b are turned on by the gate-on voltage VEL of the node QB, and the emission signal EM(1) of the gate-off voltage VEH is output to the output node No. The transistor T5 is turned off by the gate-off voltage VEH of the output node No.

Figure 10C:
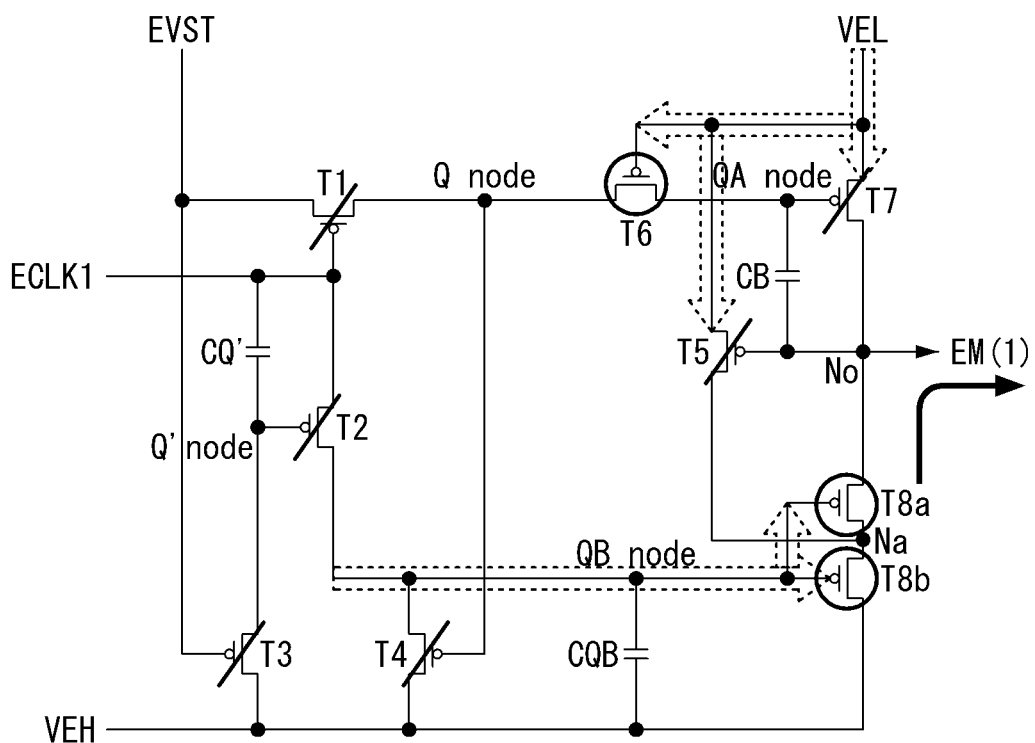

Referring to FIGS. 9 and 10C, in a period ③, the external start signal EVST and the first clock signal ECLK1 are input at the gate-off voltage VEH, and the second clock signal ECLK2 is input at the gate-on voltage VEL for a predetermined time.

In the period ③, the transistor T1 is turned off in response to the first clock signal ECLK1 of the gate-off voltage VEH, and the transistor T3 maintains an off-state in response to the external start signal EVST of the gate-off voltage VEH. Further, the node Q' is coupled to the first clock signal ECLK1 of the gate-off voltage VEH, and thus the voltage of the node Q' is changed to the gate-off voltage VEH. Hence, the node Q' turns off the transistor T2.

In the period ③, the node Q is floated and is held at the gate-off voltage VEH of the period ②. The gate-off voltage VEH of the node Q is applied to the node QA through the transistor T6 and maintains the transistor T7 in an off-state.

In the period ③, the transistor T4 maintains an off-state by the gate-off voltage VEH of the node Q. The node QB is floated by the turn-off of the transistor T2 and is held at the gate-on voltage VEL of the period ②. The transistors T8a and T8b maintain an on-state by the gate-on voltage VEL of the node QB, and the emission signal EM(1) of the gate-off voltage VEH is output to the output node No. The transistor T5 maintains an off-state by the gate-off voltage VEH of the output node No.

Figure 10D:
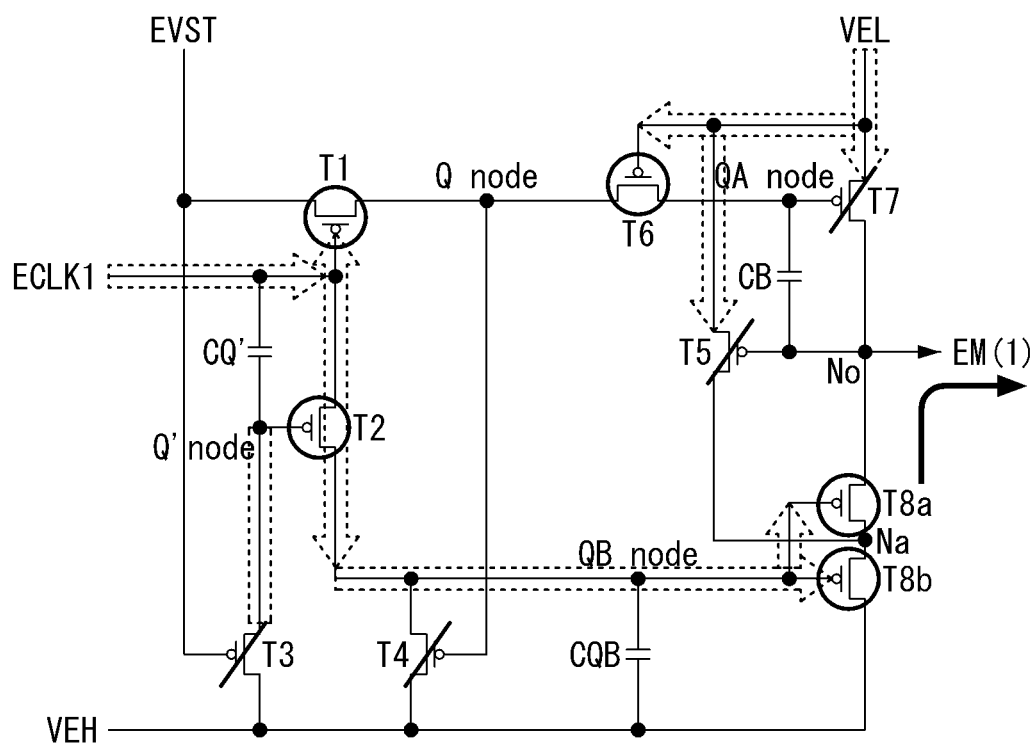

Referring to FIGS. 9 and 10D, in a period ④, the external start signal EVST and the second clock signal ECLK2 are input at the gate-off voltage VEH, and the first clock signal ECLK1 is input at the gate-on voltage VEL for a predetermined time.

An operation of the period ④ is substantially the same as an operation of the period ②. Thus, in the period ④, the transistors T1 and T2 are turned on, the transistors T6, T8a and T8b maintain an on-state, and the transistors T3, T4, T5 and T7 maintain an off-state. In the period ④, the emission signal EM(1) of the gate-off voltage VEH is output to the output node No by the transistor T7 of the off-state and the transistors T8a and T8b of the on-state.

Figure 10E:
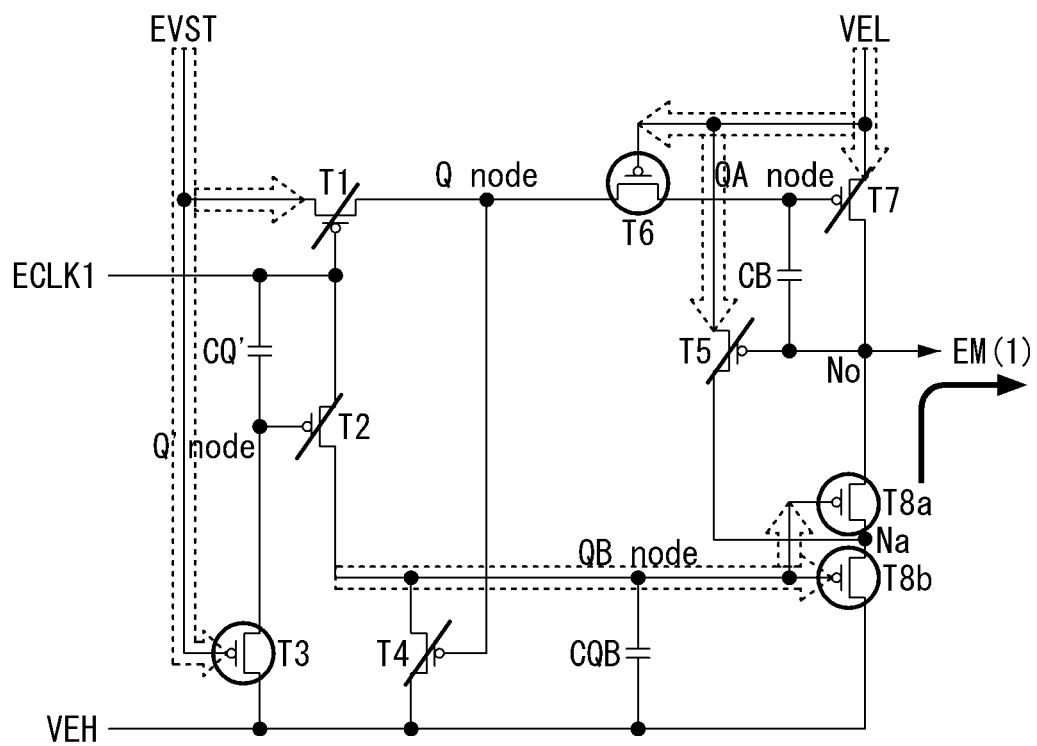

Referring to FIGS. 9 and 10E, in a period ⑤, the first clock signal ECLK1 is input at the gate-off voltage VEH, the external start signal EVST is input at the gate-on voltage VEL, and the second clock signal ECLK2 is input at the gate-on voltage VEL for a predetermined time.

In the period ⑤, the transistor T1 is turned off in response to the first clock signal ECLK1 of the gate-off voltage VEH, and the transistor T3 is turned on in response to the external start signal EVST of the gate-on voltage VEL. Hence, the gate-off voltage VEH is applied to the node Q'. The transistor T2 is turned off by the gate-off voltage VEH of the node Q'.

In the period ⑤, the node Q is floated and is held at the gate-off voltage VEH of the period ④. The gate-off voltage VEH of the node Q is applied to the node QA through the transistor T6 and maintains the transistor T7 in an off-state.

In the period ⑤, the transistor T4 maintains an off-state by the gate-off voltage VEH of the node Q. The node QB is floated by the turn-off of the transistor T2 and is held at the gate-on voltage VEL of the period ④. The transistors T8a and T8b maintain an on-state by the gate-on voltage VEL of the node QB, and the emission signal EM(1) of the gate-off voltage VEH is output to the output node No. The transistor T5 maintains an off-state by the gate-off voltage VEH of the output node No.

Figure 10F:
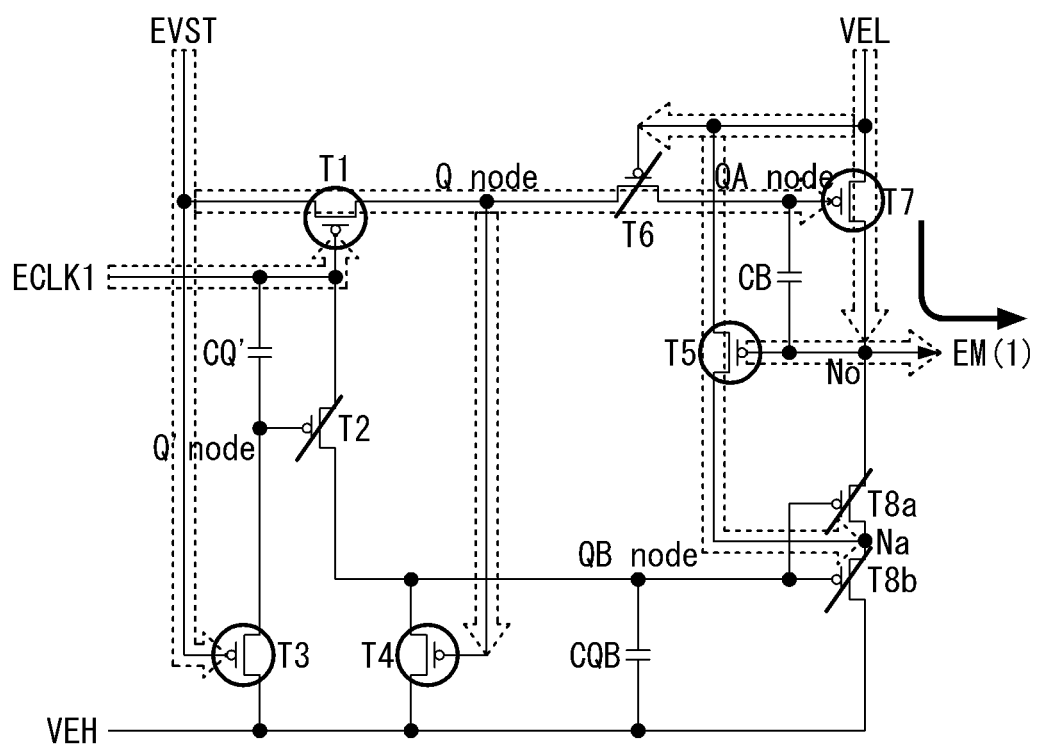

Referring to FIGS. 9 and 10F, in a period ⑥, the second clock signal ECLK2 is input at the gate-off voltage VEH, the external start signal EVST is input at the gate-on voltage VEL, and the first clock signal ECLK1 is input at the gate-on voltage VEL for a predetermined time.

In the period ⑥, the transistor T1 is turned on in response to the first clock signal ECLK1 of the gate-on voltage VEL and applies the external start signal EVST of the gate-on voltage VEL to the node Q. The gate-on voltage VEL of the node Q is applied to the node QA through the transistor T6 and turns on the transistor T7. The emission signal EM(1) of the gate-on voltage VEL is output to the output node No by the turn-on of the transistor T7, and the voltage of the output node No is changed from the gate-off voltage VEH to the gate-on voltage VEL. In this instance, a change in the voltage of the output node No is reflected to the node QA through the capacitor CB, and the voltage of the node QA is bootstrapped from the gate-on voltage VEL to the boosting voltage VEL'. When the node QA is bootstrapped to the boosting voltage VEL', the voltage of the output node No can change to the gate-on voltage VEL without the delay or the distortion. Further, a channel current does not flow in the transistor T6 due to the bootstrapping of the node QA, and the transistor T6 is in a substantial turn-off state.

In the period ⑥, the transistor T3 maintains an on-state in response to the external start signal EVST of the gate-on voltage VEL and applies the gate-off voltage VEH to the node Q'. The transistor T2 maintains an off-state by the gate-off voltage VEH of the node Q'.

In the period ⑥, the transistor T4 is turned on by the gate-on voltage VEL of the node Q, and the gate-off voltage VEH is applied to the node QB. The transistors T8a and T8b are turned off by the gate-off voltage VEH of the node QB. The transistor T5 is turned on by the gate-on voltage VEL of the output node No and applies the gate-on voltage VEL to the node Na, thereby preventing the deterioration of the transistor T8a.

Figure 10G:
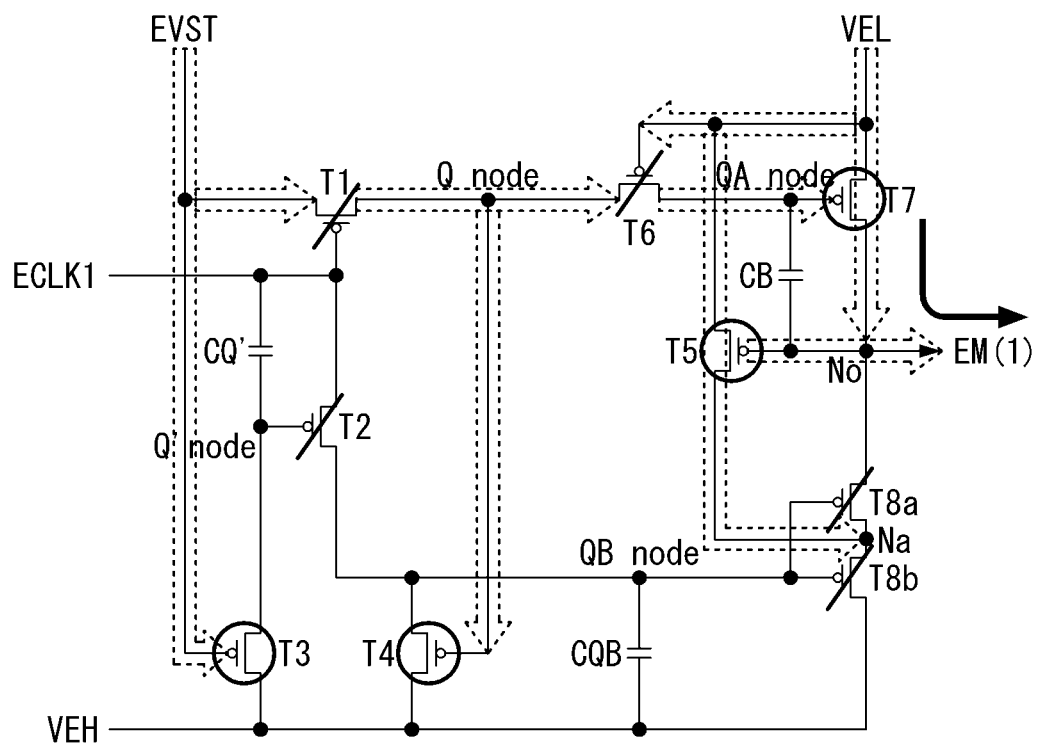

Referring to FIGS. 9 and 10G, in a period ⑦, the first clock signal ECLK1 is input at the gate-off voltage VEH, the external start signal EVST is input at the gate-on voltage VEL, and the second clock signal ECLK2 is input at the gate-on voltage VEL for a predetermined time.

An operation of the period ⑦ is substantially the same as an operation of the period ⑥, except that the transistor T1 is turned off in response to the first clock signal ECLK1 of the gate-off voltage VEH. Because the node Q is held at the gate-on voltage VEL of the period ⑥ even when the transistor T1 is turned off, the emission signal EM(1) of the gate-on voltage VEL is output to the output node No.

Figure 10H:
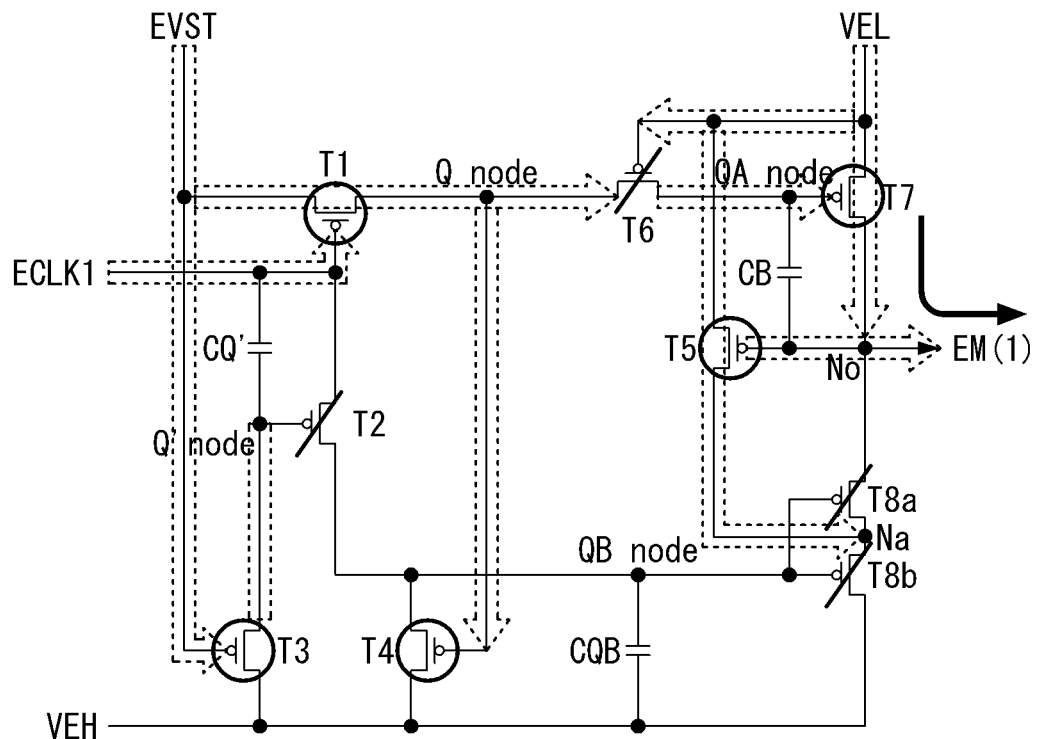

Referring to FIGS. 9 and 10H, in a period ⑧, the second clock signal ECLK2 is input at the gate-off voltage VEH, the external start signal EVST is input at the gate-on voltage VEL, and the first clock signal ECLK1 is input at the gate-on voltage VEL for a predetermined time.

An operation of the period ⑧ is substantially the same as an operation of the period ⑥. Thus, the emission signal EM(1) of the gate-on voltage VEL is output to the output node No.

FIG. 11A is a table illustrating operations of a stage corresponding to the periods ① to ④ shown in FIG. 9. FIG. 11B is a table illustrating operations of a stage corresponding to the periods ⑤ to ⑧ shown in FIG. 9.

In FIGS. 11A and 11B, "Low" indicates the gate-on voltage VEL, "High" indicates the gate-off voltage VEH, and "Very Low" indicates the boosting voltage VEL' less than the gate-on voltage VEL.

Figure 12:
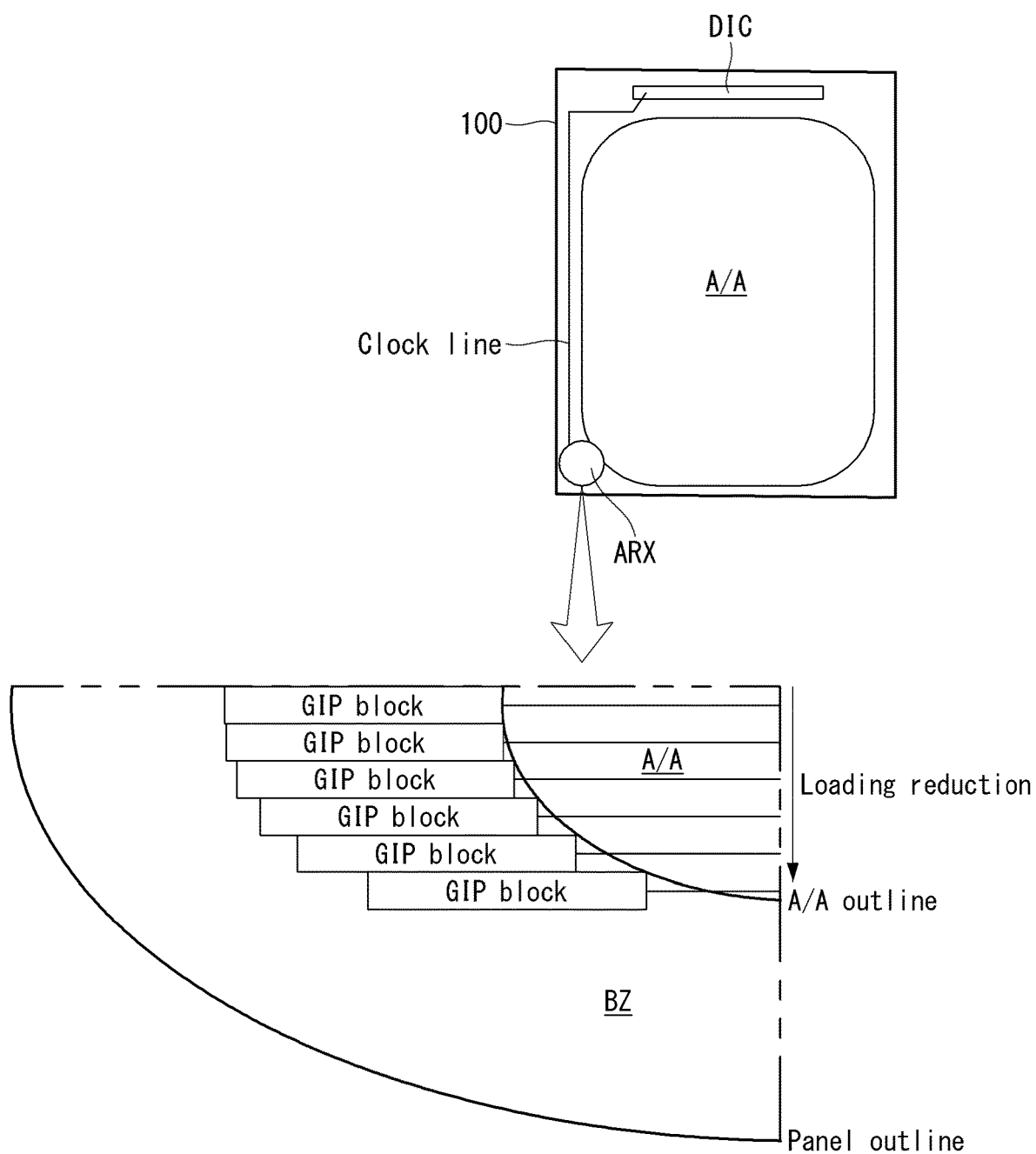
FIG. 12 illustrates an emission driver corresponding to a freeform portion according to an embodiment of the disclosure.
Figure 13:
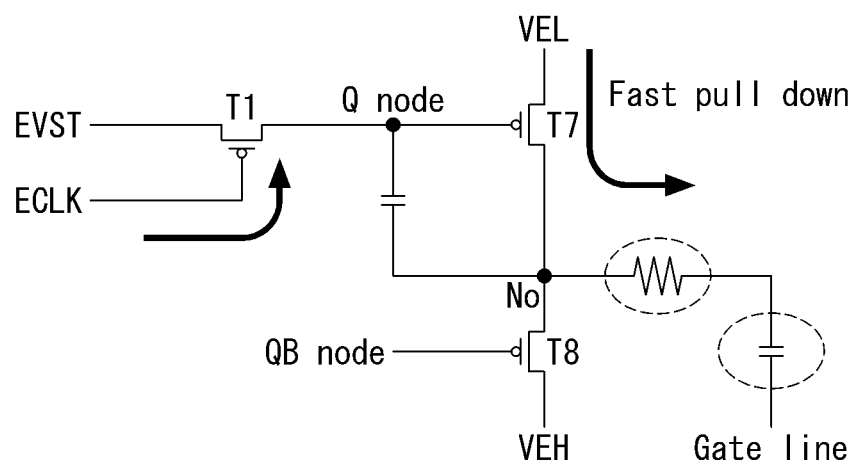
FIG. 13 illustrates a problem generated when an emission driver shown in FIGS. 6 to 11B is applied to a freeform portion according to an embodiment of the disclosure.

FIG. 12 illustrates an emission driver corresponding to a freeform portion. FIG. 13 illustrates a problem generated when the emission driver shown in FIGS. 6 to 11B is applied to a freeform portion.

The above-described emission driver substantially simultaneously implements timing, at which the node Q is activated, and timing, at which the node QA is bootstrapped, through the configuration of FIGS. 6 to 11B, and thus can maximally simplify configuration of each stage of the emission driver. Thus, the emission driver is suitable for a reduction in the bezel area. However, it may be difficult to apply the emission driver to a freeform portion having a large difference between RC loads. This is described with reference to FIG. 12.

As shown in FIG. 12, when the active area A/A of the display panel 100 has a freeform portion of a partial curved shape, a length of the gate line formed in the freeform portion is shorter than a length of the gate line formed in a non-freeform portion (e.g., a remaining portion excluding the freeform portion from the active area A/A). In other words, because of the curved part, some of the gate lines have different lengths. Thus, an RC load acting on the gate line of the freeform portion is relatively less than an RC load acting on the gate line of the non-freeform portion. When the freeform portion is positioned far away from a clock input portion DIC, an RC load acting on a clock line is larger in the freeform portion than the non-freeform portion.

GIP elements (e.g., stages) ARX of the emission driver corresponding to the freeform portion are enlarged, as shown in FIG. 12. FIG. 13 schematically shows one stage corresponding to the freeform portion. In a stage corresponding to the freeform portion, a floating timing of a node Q is later than a desired timing due to a response delay of a transistor T1 resulting from an increase in a loading of the clock line. Further, a pull-down timing of an output node is earlier than a desired timing due to a reduction in a loading of the gate line. Therefore, an output waveform of an emission signal may be distorted. Thus, a structure of the emission driver can be supplemented so that it is capable of outputting a normal emission signal in spite of such a loading deviation of the display panel. The supplemented emission driver is described in detail below with reference to FIGS. 14 to 19B.

Figure 14:
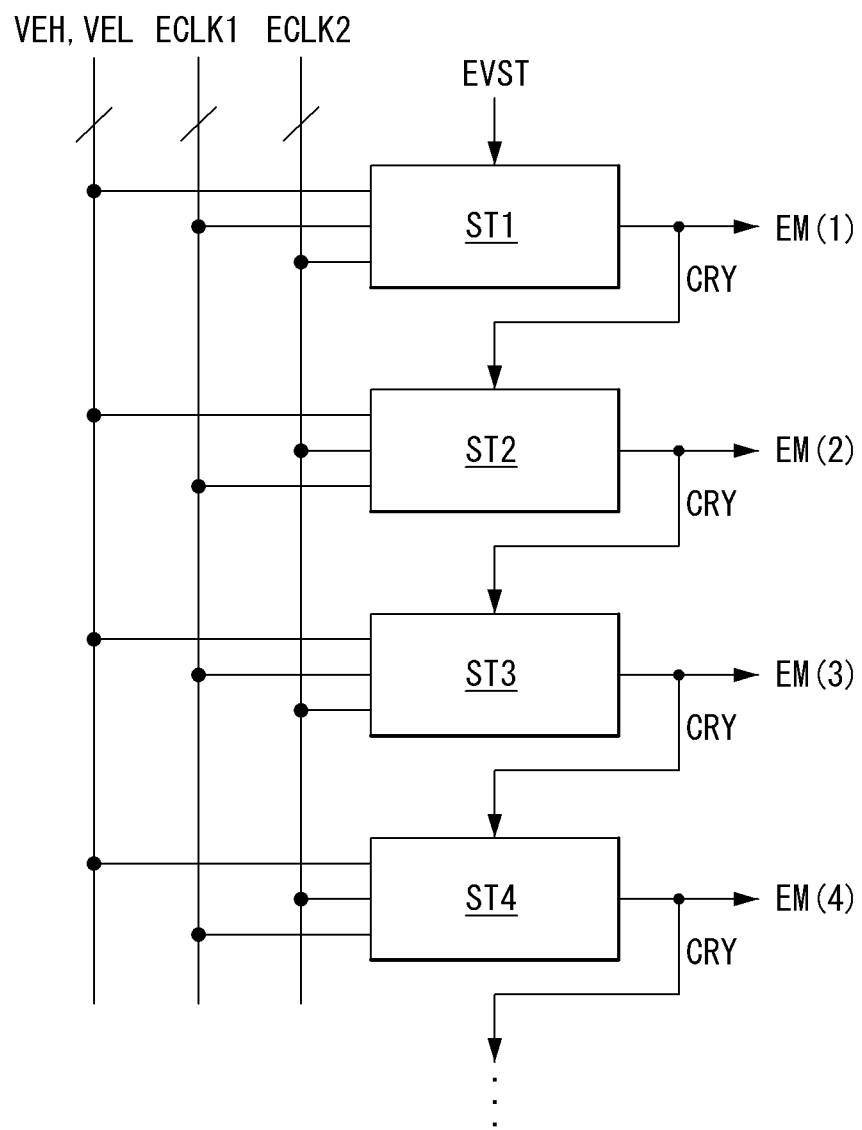
FIG. 14 illustrates another configuration of a gate shift register included in an emission driver shown in FIG. 5 according to an embodiment of the disclosure.

FIG. 14 illustrates another configuration of a gate shift register included in the emission driver shown in FIG. 5 according to an embodiment.

Referring to FIG. 14, another configuration of an emission driver 132 according to an embodiment of the disclosure can be implemented as a gate shift register including a plurality of stages ST1 to ST4, . . . . The stages ST1 to ST4, . . . can be GIP elements formed in a GIP manner.

Operations of the stages ST1 to ST4, . . . are sequentially activated in response to a start signal and output emission signals EM(1) to EM(4), . . . . An operation of the uppermost stage ST1 is activated in response to an external start signal EVST, and operations of the second uppermost stage ST2 below the uppermost stage ST1 to a lowermost stage are activated in response to an emission signal of a previous stage. The emission signal of the previous stage is used as an internal start signal and is a carry signal CRY. In embodiments disclosed herein, "previous stage" is a stage that is activated earlier than a reference stage and generates an emission signal of which a phase is earlier than a phase of an emission signal output from the reference stage.

The stages ST1 to ST4, . . . receive the external start signal EVST, a first clock signal ECLK1, and a second clock signal ECLK2 from the level shifter 150 in order to output the emission signals EM(1) to EM(4), . . . . The external start signal EVST, the first clock signal ECLK1, and the second clock signal ECLK2 may swing between the gate-off voltage VEH and the gate-on voltage VEL.

The external start signal EVST is input to the uppermost stage ST1. The first clock signal ECLK1 is input to all the stages ST1 to ST4, . . . through first clock lines, and the second clock signal ECLK2 is input to all the stages ST1 to ST4, . . . through second clock lines. Both the first and second clock signals are input to each stage in such a way that the different clock signals are input to odd-numbered stages and even-numbered stages of the plurality of stages. In other words, in the odd-numbered stages, the first clock signal is input to the first input terminal, and the second clock signal is input to the second input terminal. And in the even-numbered stages, the first clock signal is input to the second input terminal, and the second clock signal is input to the first input terminal.

The first clock signal ECLK1 and the second clock signal ECLK2 each have a different phase.

Each of the stages ST1 to ST4, . . . separates an activation timing of a node Q and a bootstrapping timing of a node QA, in order to simplify circuit configuration of the stage and output a normal emission signal in spite of a loading deviation of the display panel. Thus, each of the stages ST1 to ST4, . . . can activate the node Q based on one of the first clock signal ECLK1 and the second clock signal ECLK2, and then bootstrap the node QA based on the other of the first clock signal ECLK1 and the second clock signal ECLK2.

Each of the stages ST1 to ST4, . . . activates an operation of the node Q in response to a start signal applied to a start terminal in each frame. In embodiments disclosed herein, the fact that a node is activated indicates that the gate-on voltage VEL or a voltage corresponding to the gate-on voltage VEL is applied to the node. Further, the fact that a node is deactivated indicates that the gate-off voltage VEH or a voltage corresponding to the gate-off voltage VEH is applied to the node.

Each of the stages ST1 to ST4, . . . receives the gate-off voltage VEH and the gate-on voltage VEL from an external power supply unit. For example, the gate-off voltage VEH can be set to 20V to 30V, and the gate-on voltage VEL can be set to −10V to 0V. However, embodiments are not limited thereto.

Figure 15:
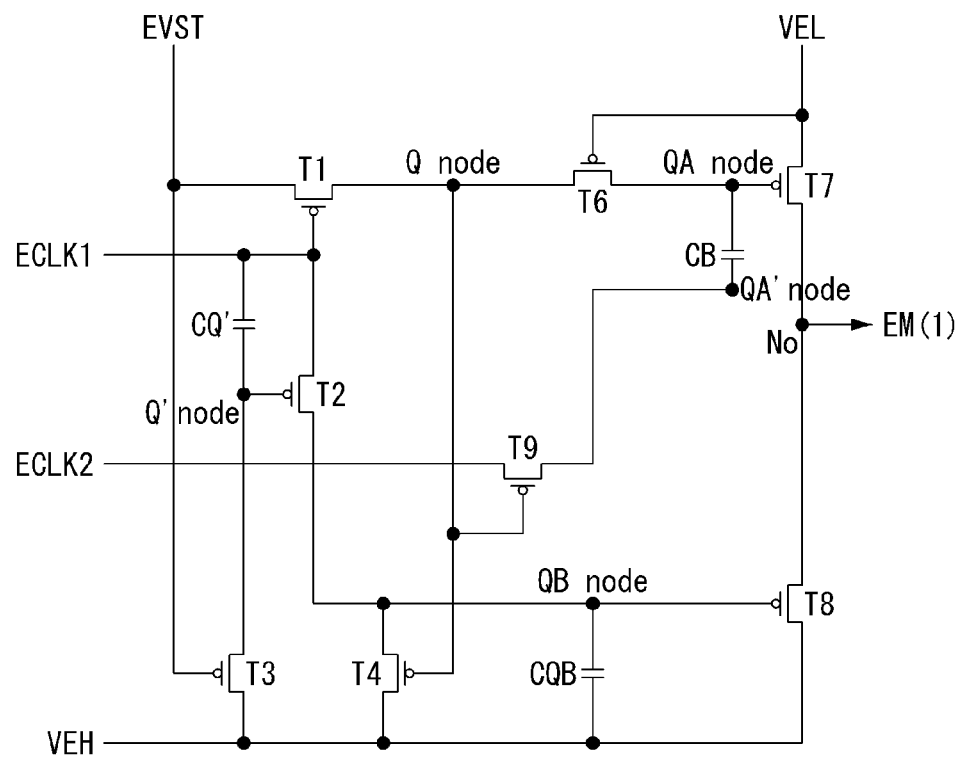
FIG. 15 illustrates configuration of an uppermost stage included in a gate shift register shown in FIG. 14 according to an embodiment of the disclosure.
Figure 16:
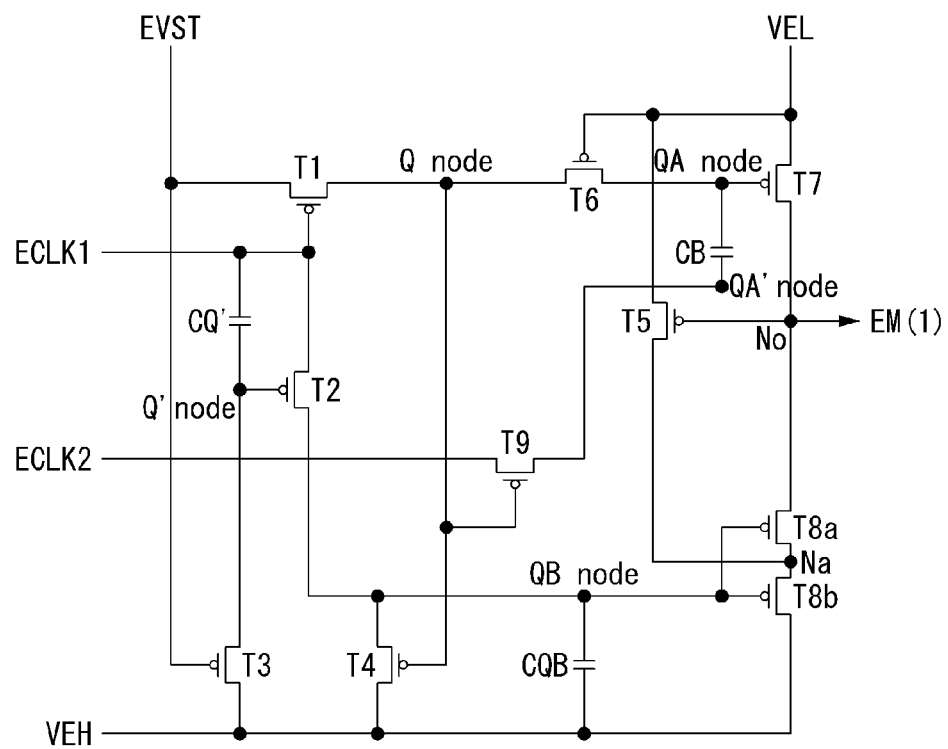
FIG. 16 illustrates another configuration of an uppermost stage included in a gate shift register shown in FIG. 14 according to an embodiment of the disclosure.

FIG. 15 illustrates configuration of an uppermost stage ST1 included in the gate shift register shown in FIG. 14. FIG. 16 illustrates another configuration of the uppermost stage ST1 included in the gate shift register shown in FIG. 14.

Configurations of the remaining odd-numbered stages except the uppermost stage ST1 are substantially the same as configuration of the uppermost stage ST1, except that they receive the internal start signal CRY instead of the external start signal EVST and output an emission signal having a different phase from the uppermost stage ST1. Further, configurations of the even-numbered stages are substantially the same as configuration of the uppermost stage ST1, except that they receive the internal start signal CRY instead of the external start signal EVST, receive the first clock signal ECLK1 and the second clock signal ECLK2 as opposed to the uppermost stage ST1, and output an emission signal having a different phase from the uppermost stage ST1.

Referring to FIG. 15, a stage ST1 outputs an emission signal EM(1) of the gate-off voltage VEH while the node Q is deactivated to the gate-off voltage VEH and a node QB is activated to the gate-on voltage VEL. Subsequently, the stage ST1 outputs the emission signal EM(1) of the gate-on voltage VEL while the node Q is activated to a voltage equal to or less than the gate-on voltage VEL and the node QB is deactivated to the gate-off voltage VEH. In other words, the stage ST1 outputs the emission signal EM(1) of the gate-on voltage VEL from when the node QA is bootstrapped in response to the second clock signal ECLK2 after the node Q is activated in response to the first clock signal ECLK1.

The stage ST1 can include a Q controller, a QB controller, a bootstrapping controller, an output unit, and a first stabilization unit.

The Q controller can be implemented as a transistor T1. The transistor T1 applies the external start signal EVST of the gate-on voltage VEL to the node Q in response to the first clock signal ECLK1 and activates the node Q. A gate electrode of the transistor T1 is connected to an input terminal of the first clock signal ECLK1, and a first electrode and a second electrode of the transistor T1 are connected to an input terminal of the external start signal EVST and the node Q, respectively.

The QB controller activates the node QB as opposed to the node Q in response to the first clock signal ECLK1, the start external signal EVST, and a voltage of the node Q. The QB controller can include a capacitor CQ', a transistor T2, a transistor T3, a transistor T4, and a capacitor CQB.

The capacitor CQ' is connected between the input terminal of the first clock signal ECLK1 and a node Q'. The transistor T2 supplies the first clock signal ECLK1 to the node QB in accordance with a voltage of the node Q'. A gate electrode of the transistor T2 is connected to the node Q', and a first electrode and a second electrode of the transistor T2 are connected to the input terminal of the first clock signal ECLK1 and the node QB, respectively. The transistor T3 supplies the gate-off voltage VEH to the node Q' in response to the external start signal EVST. A gate electrode of the transistor T3 is connected to the input terminal of the external start signal EVST, and a first electrode and a second electrode of the transistor T3 are connected to the node Q' and an input terminal of the gate-off voltage VEH, respectively. According to the above-described configuration, the voltage of the node Q' changes in synchronization with the first clock signal ECLK1 while the external start signal EVST is held at the gate-off voltage VEH. Further, the voltage of the node Q' becomes the gate-off voltage VEH while the external start signal EVST is held at the gate-on voltage VEL.

The transistor T4 supplies the gate-off voltage VEH to the node QB in accordance with the voltage of the node Q. A gate electrode of the transistor T4 is connected to the node Q, and a first electrode and a second electrode of the transistor T4 are connected to the node QB and the input terminal of the gate-off voltage VEH, respectively. The capacitor CQB is connected between the node QB and the input terminal of the gate-off voltage VEH to stabilize the voltage of the node QB.

The bootstrapping controller bootstraps the node QA in response to the second clock signal ECLK2. The bootstrapping controller includes a transistor T9 and a capacitor CB. The transistor T9 supplies the second clock signal ECLK2 of the gate-on voltage VEL to a node QA' in accordance with the gate-on voltage VEL of the node Q. A gate electrode of the transistor T9 is connected to the node Q, and a first electrode and a second electrode of the transistor T9 are connected to the input terminal of the second clock signal ECLK2 and the node QA', respectively. The capacitor CB is connected between the node QA and the node QA' and reflects a change in a voltage of the node QA' changing from the gate-off voltage VEH to the gate-on voltage VEL to the node QA, thereby bootstrapping the node QA.

The output unit includes a transistor T7 serving as a pull-down element and a transistor T8 serving as a pull-up element.

The transistor T7 supplies the emission signal EM (1) of the gate-on voltage VEL to an output node No from when the node QA is bootstrapped. A gate electrode of the transistor T7 is connected to the node QA, and a first electrode and a second electrode of the transistor T7 are connected to an input terminal of the gate-on voltage VEL and the output node No, respectively. The transistor T8 supplies the emission signal EM(1) of the gate-off voltage VEH to the output node No while the node QB is activated prior to the node Q. A gate electrode of the transistor T8 is connected to the node QB, and a first electrode and a second electrode of the transistor T8 are connected to the output node No and the input terminal of the gate-off voltage VEH, respectively.

The first stabilization unit can be implemented as a transistor T6. A gate electrode of the transistor T6 is connected to the input terminal of the gate-on voltage VEL, and a first electrode and a second electrode of the transistor T6 are connected to the node Q and the node QA, respectively. When the node QA is bootstrapped, a channel current between the first electrode and the second electrode of the transistor T6 becomes zero. In other words, when the node QA is bootstrapped, the transistor T6 is turned off to thereby block an electrical connection between the node Q and the node QA. Hence, the transistor T6 can reduce a load applied to the transistors connected to the node Q. Further, the transistor T6 maintains a turn-on state while the node QA is not bootstrapped.

The transistor T6 maintains the turn-on state and is turned off only when the node QA is bootstrapped, thereby blocking a current from flowing between the node Q and the node QA. Thus, when the node QA is bootstrapped, the voltage of the node Q is different from the voltage of the node QA. Even when the voltage of the node QA changes at the moment when the node QA is bootstrapped, the voltage of the node Q does not change. Therefore, the transistors T1 and T4 connected to the node Q are not overloaded at the moment when the node QA is bootstrapped. If there is no transistor T6, a drain-to-source voltage Vds of the transistor T1 and a gate-to-source voltage Vgs of the transistor T4 may increase to a voltage level equal to or greater than a critical value due to the bootstrapping. If such an overload phenomenon continues, a device breakdown phenomenon, so-called, a breakdown phenomenon may occur. The transistor T6 can prevent the transistors T1 and T4 connected to the node Q from breaking down at the moment when the node QA is bootstrapped.

Circuit configuration of a stage shown in FIG. 16 is different from circuit configuration of the stage shown in FIG. 15, in that the transistor T8 is configured in a dual gate structure, and a transistor T5 is added. A circuit of FIG. 16 has an advantage that it is easier to suppress a leakage current of a pull-up element than the circuit of FIG. 15.

Referring to FIG. 16, a transistor T8 can include a transistor T8a and a transistor T8b that are connected in series to each other. A gate electrode of the transistor T8a is connected to the node QB, a first electrode of the transistor T8a is connected to the output node No, and a second electrode of the transistor T8a is connected to a node Na. A gate electrode of the transistor T8b is connected to the node QB, a first electrode of the transistor T8b is connected to the node Na, and a second electrode of the transistor T8b is connected to the input terminal of the gate-off voltage VEH.

A gate electrode of the transistor T5 is connected to the output node No, a first electrode of the transistor T5 is connected to the input terminal of the gate-on voltage VEL, and a second electrode of the transistor T5 is connected to the node Na.

The emission signal EM(1) output from the stage ST1 is held at the gate-on voltage VEL during most of one frame period. Thus, the voltage of the output node No is held at the gate-on voltage VEL during most of one frame period.

When the transistor T8 of FIG. 15 is used, there is a large difference (e.g., a difference between the voltages VEH and VEL) between a drain voltage and a source voltage of the transistor T8 when the voltage of the output node No holds the gate-on voltage VEL. When the large voltage difference lasts for a long time, the transistor T8 is easily deteriorated. When a leakage current flows in the transistor T8 due to the deterioration of the transistor T8, the normal emission signal EM(1) cannot be output.

On the contrary, when the transistor T8 of FIG. 16 is used, the gate-on voltage VEL is applied to the node Na through the transistor T5 while the voltage of the output node No holds the gate-on voltage VEL. Therefore, a difference (e.g., a difference between the voltages VEL and VEL) between a drain voltage and a source voltage of the transistor T8 is ideally zero. Thus, deterioration of the transistor T8 is prevented. Even when the transistor T8b is deteriorated while the voltage of the output node No holds the gate-on voltage VEL, and a leakage current flows in the transistor T8b, the transistor T8a can suppress a flow of the leakage current.

Figure 17:
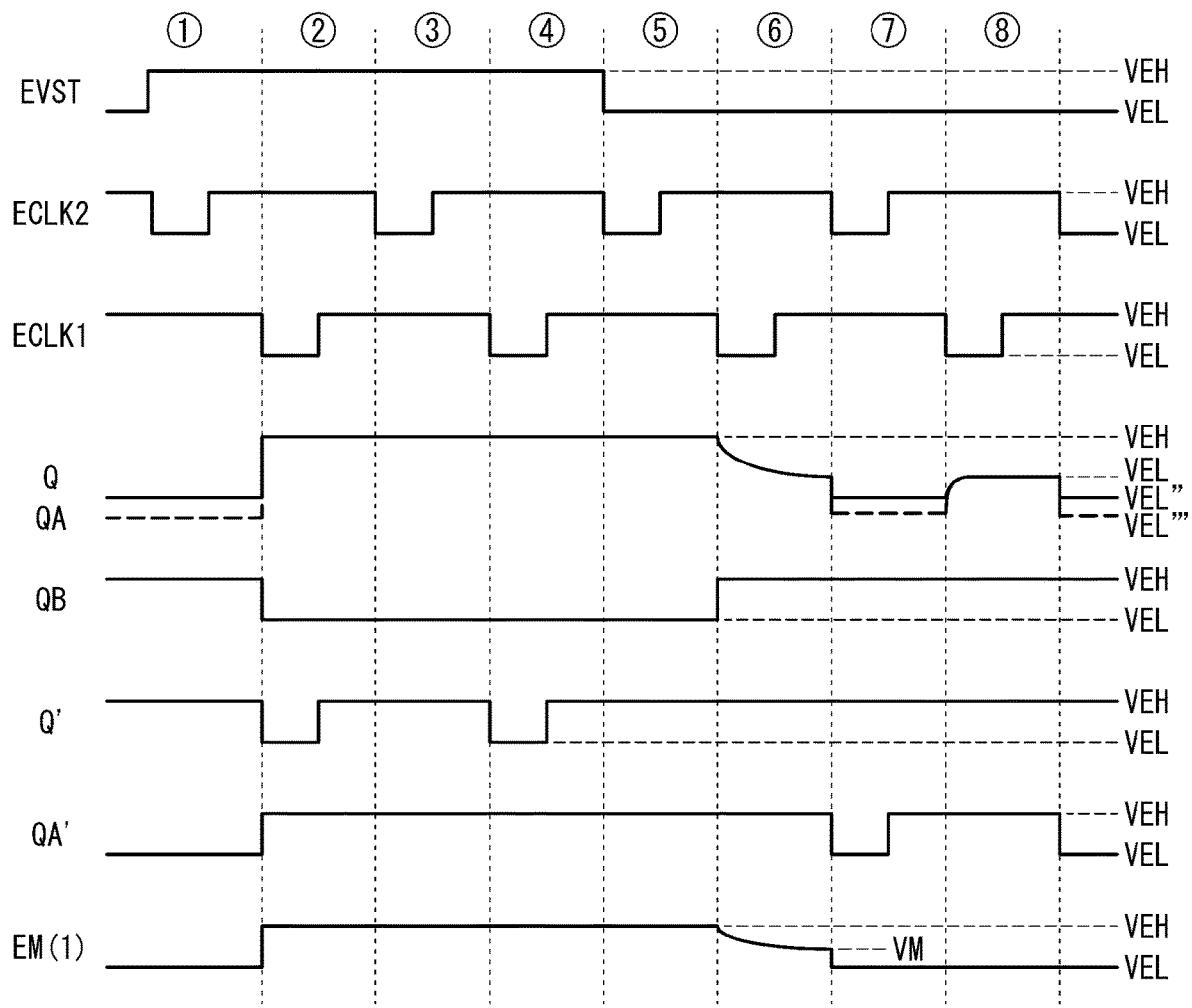
FIG. 17 illustrates an operation waveform of a stage shown in FIG. 16 according to an embodiment of the disclosure.

FIG. 17 illustrates an operation waveform of a stage shown in FIG. 16. FIGS. 18A to 18H illustrate operation states of a stage respectively corresponding to periods ① to ⑧ shown in FIG. 17.

Figure 18A:
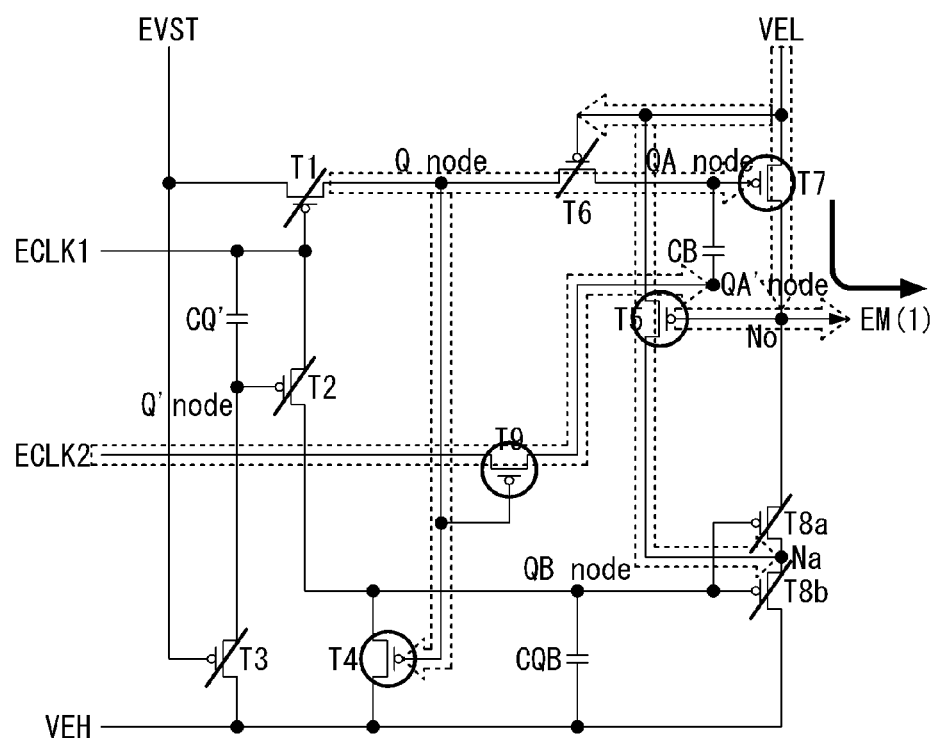
FIGS. 18A to 18H illustrate operation states of a stage respectively corresponding to periods ① to ⑧ shown in FIG. 17 according to an embodiment of the disclosure.

Referring to FIGS. 17 and 18A, in a period ①, the external start signal EVST and the first clock signal ECLK1 are input at the gate-off voltage VEH, and the second clock signal ECLK2 is input at the gate-on voltage VEL for a predetermined time.

In the period ①, the transistor T1 is turned off in response to the first clock signal ECLK1 of the gate-off voltage VEH, and the transistor T3 is turned off in response to the external start signal EVST of the gate-off voltage VEH. Further, the transistor T2 is turned off by the gate-off voltage VEH of the node Q'.

In the period ①, the node Q holds a first gate-on voltage VEL" of a previous frame. The first gate-on voltage VEL" may be less than the gate-on voltage VEL. The transistor T9 is turned on by the first gate-on voltage VEL" of the node Q and supplies the second clock signal ECLK2 of the gate-on voltage VEL to the node QA'. Thus, the node QA is bootstrapped in response to the second clock signal ECLK2 of the gate-on voltage VEL and is held at a first boosting voltage VEL'". The first boosting voltage VEL'" may be less than the first gate-on voltage VEL". The transistor T7 is turned on by the first boosting voltage VEL'" of the node QA, and the emission signal EM(1) of the gate-on voltage VEL is output to the output node No.

In the period ①, the transistor T4 is turned on by the first gate-on voltage VEL" of the node Q, and the gate-off voltage VEH is applied to the node QB. Further, the transistors T8a and T8b are turned off by the gate-off voltage VEH of the node QB. The transistor T5 is turned on by the gate-on voltage VEL of the output node No and applies the gate-on voltage VEL to the node Na, thereby preventing the deterioration of the transistor T8a.

In the period ①, a channel current does not flow in the transistor T6 due to the bootstrapping of the node QA, and the transistor T6 is in a substantial turn-off state.

Figure 18B:
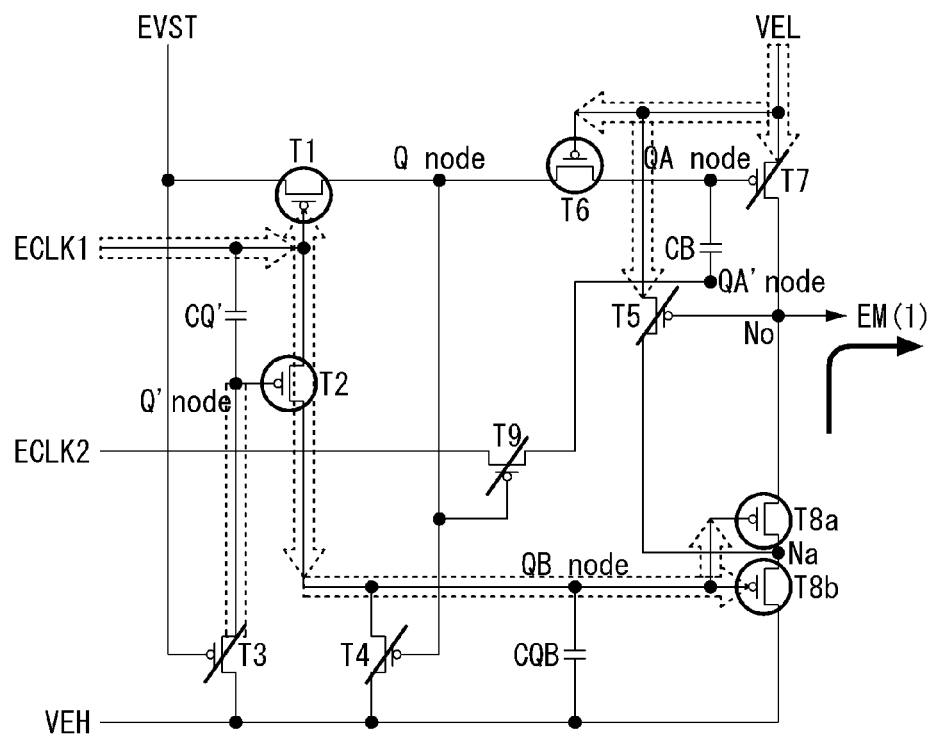

Referring to FIGS. 17 and 18B, in a period ②, the external start signal EVST and the second clock signal ECLK2 are input at the gate-off voltage VEH, and the first clock signal ECLK1 is input at the gate-on voltage VEL for a predetermined time.

In the period ②, the transistor T1 is turned on in response to the first clock signal ECLK1 of the gate-on voltage VEL, and the transistor T3 maintains an off-state in response to the external start signal EVST of the gate-off voltage VEH. Further, the node Q' is coupled to the first clock signal ECLK1 of the gate-on voltage VEL, and thus the voltage of the node Q' is changed to the gate-on voltage VEL. Hence, the node Q' turns on the transistor T2.

In the period ②, the external start signal EVST of the gate-off voltage VEH is applied to the node Q through the transistor T1. The gate-off voltage VEH of the node Q is applied to the node QA through the transistor T6 and turns off the transistor T7.

In the period ②, the transistor T4 is turned off by the gate-off voltage VEH of the node Q, and the first clock signal ECLK1 of the gate-on voltage VEL is applied to the node QB through the transistor T2. Thus, the transistors T8a and T8b are turned on by the gate-on voltage VEL of the node QB, and the emission signal EM(1) of the gate-off voltage VEH is output to the output node No. The transistor T5 is turned off by the gate-off voltage VEH of the output node No.

In the period ②, the transistor T9 is turned off by the gate-off voltage VEH of the node Q and floats the node QA'. Thus, the node QA' is bootstrapped to the gate-off voltage VEH depending on change in the voltage of the node QA.

Figure 18C:
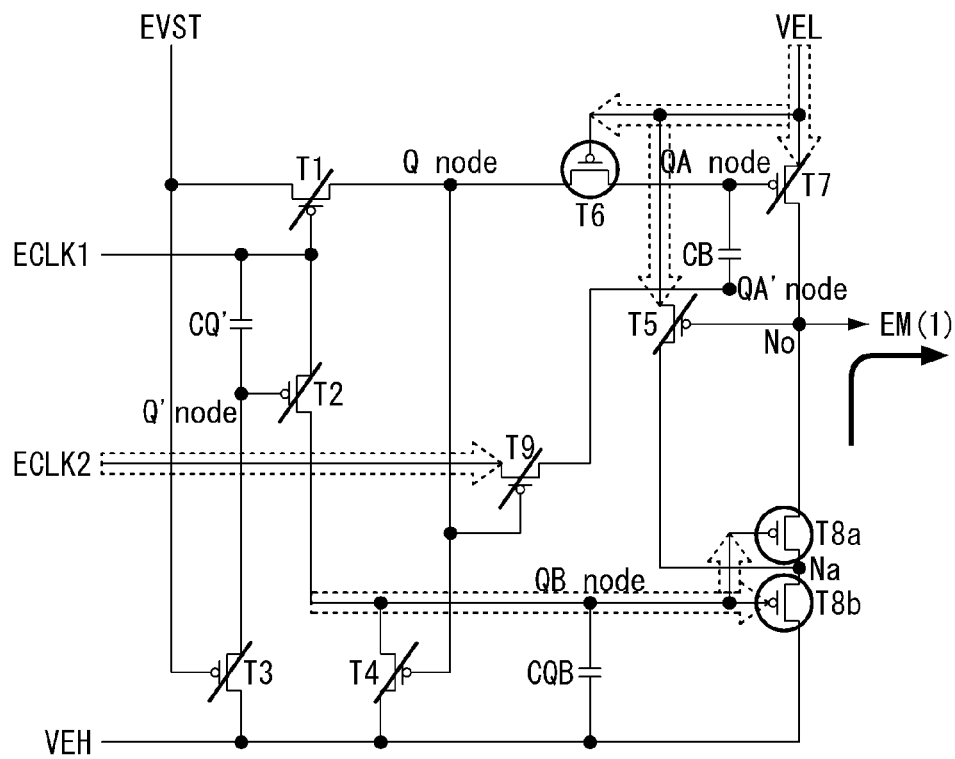

Referring to FIGS. 17 and 18C, in a period ③, the external start signal EVST and the first clock signal ECLK1 are input at the gate-off voltage VEH, and the second clock signal ECLK2 is input at the gate-on voltage VEL for a predetermined time.

In the period ③, the transistor T1 is turned off in response to the first clock signal ECLK1 of the gate-off voltage VEH, and the transistor T3 maintains an off-state in response to the external start signal EVST of the gate-off voltage VEH. Further, the node Q' is coupled to the first clock signal ECLK1 of the gate-off voltage VEH, and thus the voltage of the node Q' is changed to the gate-off voltage VEH. Hence, the node Q' turns off the transistor T2.

In the period ③, the node Q is floated and is held at the gate-off voltage VEH of the period ②. The gate-off voltage VEH of the node Q is applied to the node QA through the transistor T6 and maintains the transistor T7 in an off-state.

In the period ③, the transistor T4 maintains an off-state by the gate-off voltage VEH of the node Q. The node QB is floated by the turn-off of the transistor T2 and is held at the gate-on voltage VEL of the period ②. The transistors T8a and T8b maintain an on-state by the gate-on voltage VEL of the node QB, and the emission signal EM(1) of the gate-off voltage VEH is output to the output node No. The transistor T5 maintains an off-state by the gate-off voltage VEH of the output node No.

In the period ③, the transistor T9 maintains an off-state by the gate-off voltage VEH of the node Q and floats the node QA'. Thus, the node QA' holds the gate-off voltage VEH of the period ②.

Figure 18D:
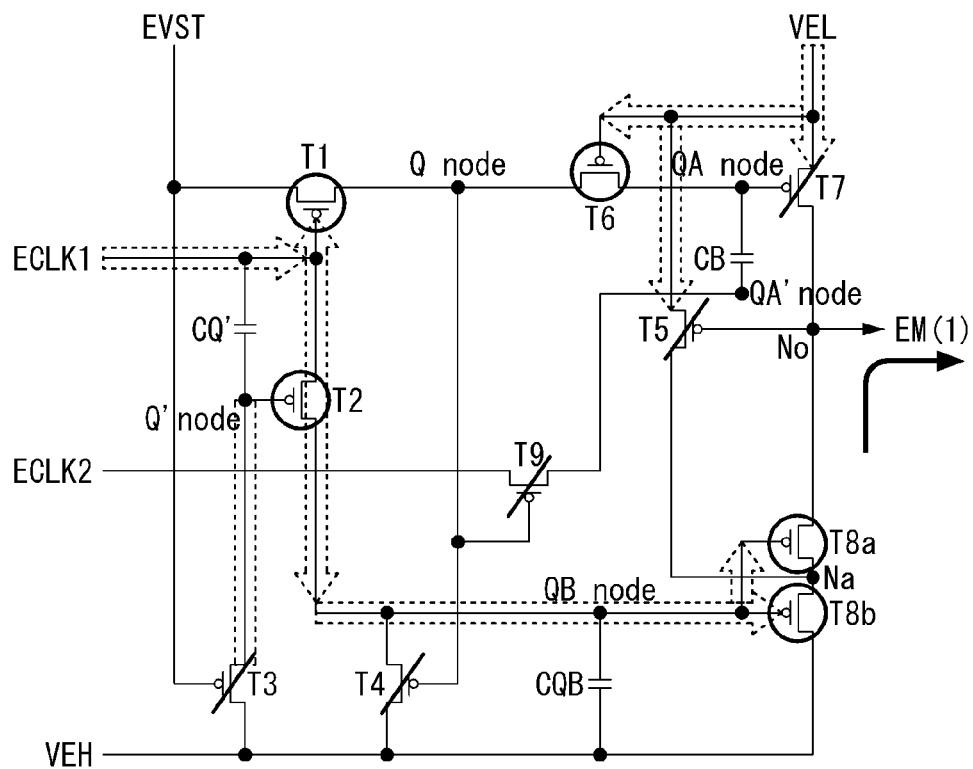

Referring to FIGS. 17 and 18D, in a period ④, the external start signal EVST and the second clock signal ECLK2 are input at the gate-off voltage VEH, and the first clock signal ECLK1 is input at the gate-on voltage VEL for a predetermined time.

An operation of the period ④ is substantially the same as an operation of the period ②. Thus, in the period ④, the transistors T1 and T2 are turned on, the transistors T6, T8a and T8b maintain an on-state, and the transistors T3, T4, T5, T7 and T9 maintain an off-state. In the period ④, the emission signal EM(1) of the gate-off voltage VEH is output to the output node No by the transistor T7 of the off-state and the transistors T8a and T8b of the on-state.

Figure 18E:
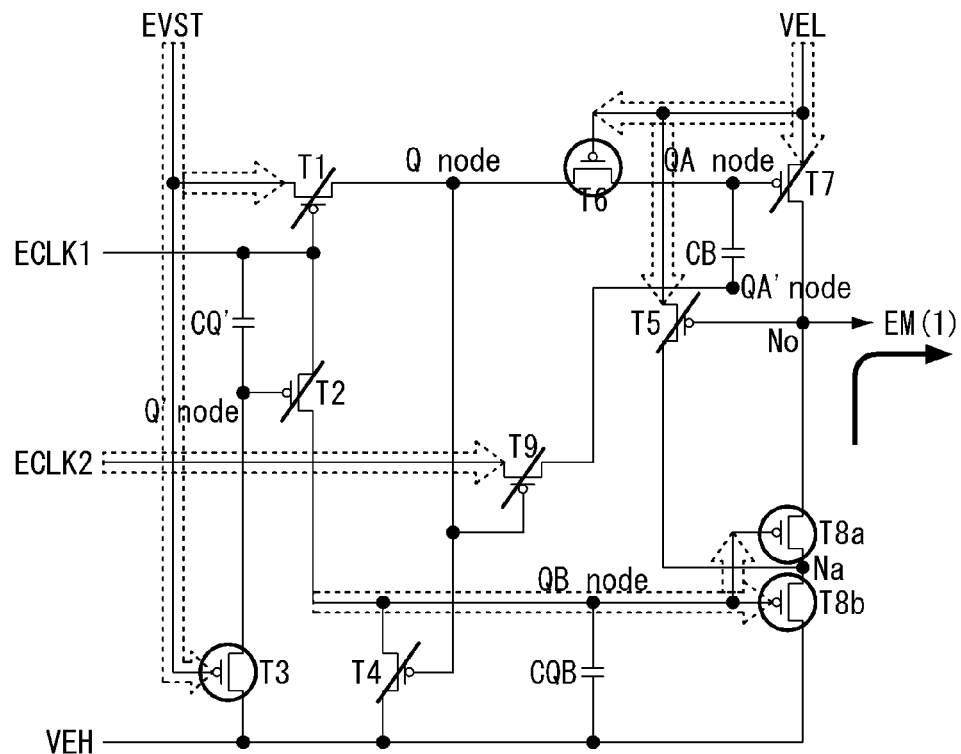

Referring to FIGS. 17 and 18E, in a period ⑤, the first clock signal ECLK1 is input at the gate-off voltage VEH, the external start signal EVST is input at the gate-on voltage VEL, and the second clock signal ECLK2 is input at the gate-on voltage VEL for a predetermined time.

In the period ⑤, the transistor T1 is turned off in response to the first clock signal ECLK1 of the gate-off voltage VEH, and the transistor T3 is turned on in response to the external start signal EVST of the gate-on voltage VEL. Hence, the gate-off voltage VEH is applied to the node Q'. The transistor T2 is turned off by the gate-off voltage VEH of the node Q'.

In the period ⑤, the node Q is floated and is held at the gate-off voltage VEH of the period ④. The gate-off voltage VEH of the node Q is applied to the node QA through the transistor T6 and maintains the transistor T7 in an off-state.

In the period ⑤, the transistor T4 maintains an off-state by the gate-off voltage VEH of the node Q. The node QB is floated by the turn-off of the transistor T2 and is held at the gate-on voltage VEL of the period ④. The transistors T8a and T8b maintain an on-state by the gate-on voltage VEL of the node QB, and the emission signal EM(1) of the gate-off voltage VEH is output to the output node No. The transistor T5 maintains an off-state by the gate-off voltage VEH of the output node No.

In the period ⑤, the transistor T9 maintains an off-state by the gate-off voltage VEH of the node Q and continuously floats the node QA'. Thus, the node QA' holds the gate-off voltage VEH of the period ②.

Figure 18F:
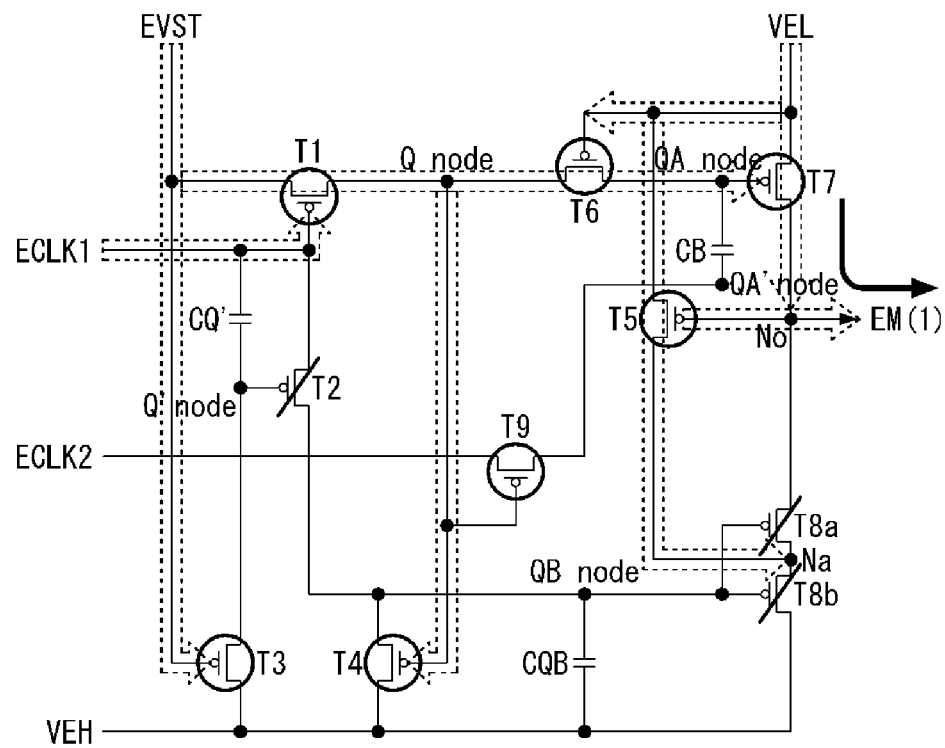

Referring to FIGS. 17 and 18F, in a period ⑥, the second clock signal ECLK2 is input at the gate-off voltage VEH, the external start signal EVST is input at the gate-on voltage VEL, and the first clock signal ECLK1 is input at the gate-on voltage VEL for a predetermined time.

In the period ⑥, the transistor T1 is turned on in response to the first clock signal ECLK1 of the gate-on voltage VEL and applies the external start signal EVST of the gate-on voltage VEL to the node Q. The gate-on voltage VEL of the node Q is applied to the node QA through the transistor T6 and turns on the transistor T7. The emission signal EM(1) of the gate-on voltage VEL is output to the output node No by the turn-on of the transistor T7, and the voltage of the output node No is changed from the gate-off voltage VEH to the gate-on voltage VEL.

In this instance, the transistor T9 is turned on by the gate-on voltage VEL of the node Q and supplies the second clock signal ECLK2 of the gate-off voltage VEH to the node QA'. The voltage of the node QA' is held at the gate-off voltage VEH in the same manner as the period ⑤. In this instance, because the node QA is connected to the input terminal of the external start signal EVST (e.g., the node QA is not floated), the node QA is not bootstrapped. Because the node QA is not bootstrapped, the voltage of the output node No is gradually changed from the gate-off voltage VEH to a middle voltage VM. For example, see the gradually decreasing portions of Q and EM(1) in period ⑥ of FIG. 17. In embodiments disclosed herein, the middle voltage VM is a specific voltage between the gate-off voltage VEH and the gate-on voltage VEL.

In the period ⑥, the transistor T3 maintains an on-state in response to the external start signal EVST of the gate-on voltage VEL and applies the gate-off voltage VEH to the node Q'. The transistor T2 maintains an off-state by the gate-off voltage VEH of the node Q'.

In the period ⑥, the transistor T4 is turned on by the gate-on voltage VEL of the node Q, and the gate-off voltage VEH is applied to the node QB. The transistors T8a and T8b are turned off by the gate-off voltage VEH of the node QB. The transistor T5 is turned on by the gate-on voltage VEL of the output node No and applies the gate-on voltage VEL to the node Na, thereby preventing the deterioration of the transistor T8a.

Figure 18G:
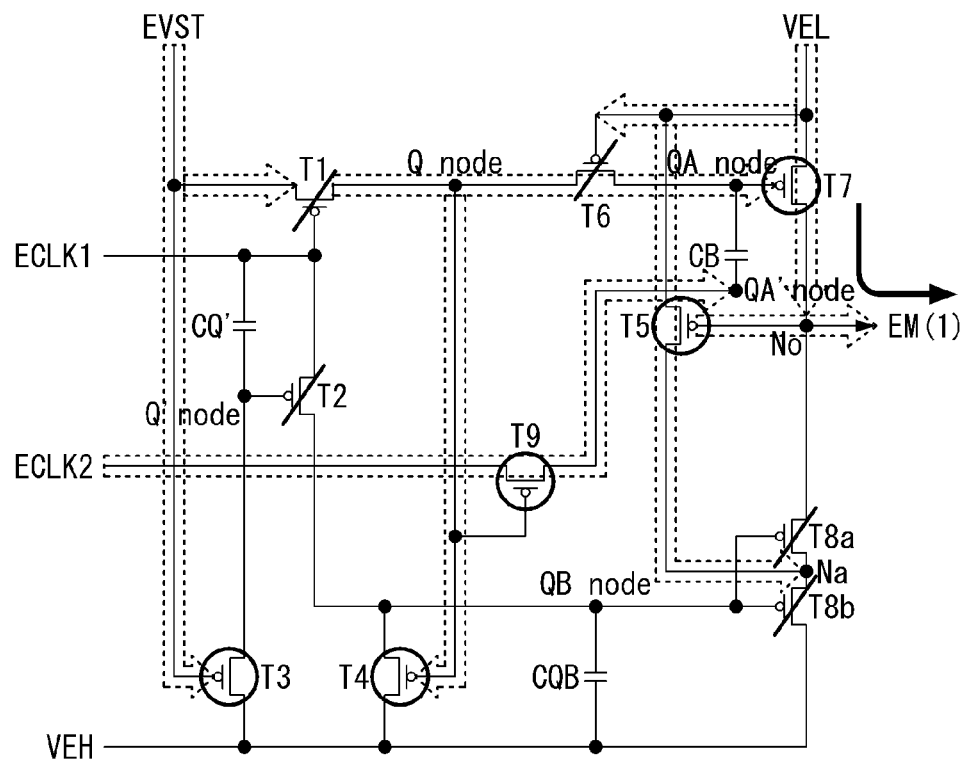

Referring to FIGS. 17 and 18G, in a period ⑦, the first clock signal ECLK1 is input at the gate-off voltage VEH, the external start signal EVST is input at the gate-on voltage VEL, and the second clock signal ECLK2 is input at the gate-on voltage VEL for a predetermined time.

In the period ⑦, the transistor T1 is turned off in response to the first clock signal ECLK1 of the gate-off voltage VEH, and the transistor T3 maintains an on-state in response to the external start signal EVST of the gate-on voltage VEL and applies the gate-off voltage VEH to the node Q'. The transistor T2 maintains an off-state by the gate-off voltage VEH of the node Q'.

In the period ⑦, the node Q is floated and is held at the gate-on voltage VEL of the period ⑥. In this instance, the transistor T9 is turned on by the gate-on voltage VEL of the node Q and supplies the second clock signal ECLK2 of the gate-on voltage VEL to the node QA'. Thus, the node Q and the node QA are reduced to the first gate-on voltage VEL" in response to the second clock signal ECLK2 of the gate-on voltage VEL, and then a channel current does not flow in the transistor T6 due to the bootstrapping of the node QA. As a result, the node Q is changed to the first gate-on voltage VEL", and the node QA is changed to the first boosting voltage VEL'" which is lower than the first gate-on voltage VEL". The transistor T7 is turned on by the first boosting voltage VEL'" of the node QA, and the emission signal EM(1) of the gate-on voltage VEL is output to the output node No.

In the period (7), the transistor T4 maintains an off-state by the first gate-on voltage VEL" of the node Q, and the gate-off voltage VEH is applied to the node QB. Further, the transistors T8a and T8b maintain an off-state by the gate-off voltage VEH of the node QB. The transistor T5 maintains an on-state by the gate-on voltage VEL of the output node No and continuously applies the gate-on voltage VEL to the node Na, thereby preventing the deterioration of the transistor T8a.

Figure 18H:
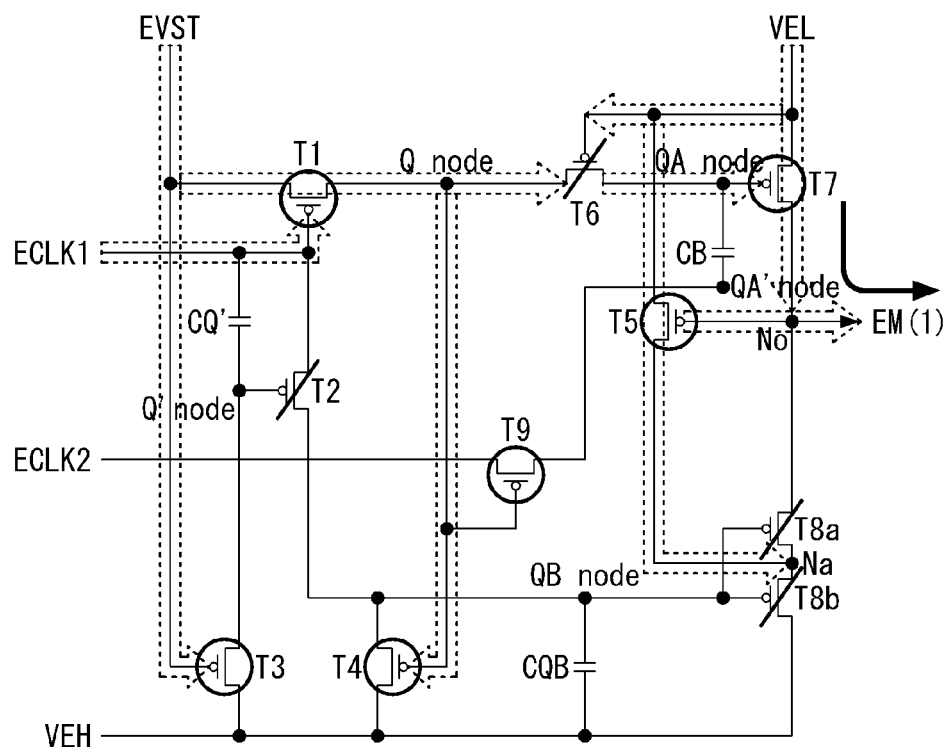

Referring to FIGS. 17 and 18H, in a period (8), the second clock signal ECLK2 is input at the gate-off voltage VEH, the external start signal EVST is input at the gate-on voltage VEL, and the first clock signal ECLK1 is input at the gate-on voltage VEL for a predetermined time.

In the period (8), the transistor T1 is turned on in response to the first clock signal ECLK1 of the gate-on voltage VEL and applies the external start signal EVST of the gate-on voltage VEL to the node Q. The gate-on voltage VEL of the node Q is applied to the node QA through the transistor T6 and maintains the transistor T7 in an on-state. The emission signal EM(1) of the gate-on voltage VEL is continuously output to the output node No due to the turn-on of the transistor T7.

In this instance, the transistor T9 maintains an on-state by the gate-on voltage VEL of the node Q and supplies the second clock signal ECLK2 of the gate-off voltage VEH to the node QA'. Because the node QA is connected to the input terminal of the external start signal EVST through the transistors T1 and T6, the node QA is not bootstrapped. Because the node QA is not bootstrapped, the voltage of the output node No is held at the gate-on voltage VEL.

In the period (8), the transistor T3 maintains an on-state in response to the external start signal EVST of the gate-on voltage VEL and applies the gate-off voltage VEH to the node Q'. The transistor T2 maintains an off-state by the gate-off voltage VEH of the node Q'.

In the period (8), the transistor T4 maintains an on-state by the first gate-on voltage VEL of the node Q, and the gate-off voltage VEH is applied to the node QB. Further, the transistors T8a and T8b maintain an off-state by the gate-off voltage VEH of the node QB. The transistor T5 maintains an on-state by the gate-on voltage VEL of the output node No and continuously applies the gate-on voltage VEL to the node Na, thereby preventing the deterioration of the transistor T8a.

FIG. 19A is a table illustrating operations of a stage corresponding to periods (1) to (4) shown in FIG. 17. FIG. 19B is a table illustrating operations of a stage corresponding to periods (5) to (8) shown in FIG. 17.

In FIGS. 19A and 19B, "Low" indicates the gate-on voltage VEL, "High" indicates the gate-off voltage VEH. Further, "Very Low" indicates the first gate-on voltage VEL" less than the gate-on voltage VEL, and "Extreme Low" indicates the first boosting voltage VEL'" which is less than the first gate-on voltage VEL".

As described above, the embodiments of the disclosure can maximally simplify the configuration of the stages of the emission driver and thus can very easily implement narrow bezel technology.

Furthermore, the embodiments of the disclosure can maximally simplify the configuration of the stages of the emission driver and can also greatly increase operation stability and reliability of the emission driver in spite of the shape of the display panel (e.g., even when the display panel has rounded corners).

A gate driver and an electroluminescent display including the same according to embodiments of the disclosure can be described as follows.

A gate driver according to an embodiment of the disclosure includes a plurality of stages. Each stage includes a transistor T1 configured to apply a start signal of a gate-on voltage to a node Q in response to a clock signal and activate the node Q, a transistor T7 configured to supply an emission signal of the gate-on voltage to an output node from when a node QA is bootstrapped in synchronization with a timing at which the node Q is activated, a QB controller configured to activate a node QB as opposed to the node Q in response to the clock signal, the start signal, and a voltage of the node Q, and a transistor T8 configured to supply the emission signal of a gate-off voltage to the output node while the node QB is activated prior to the node Q.

Each stage further includes a capacitor CB connected between the output node and the node QA. When the emission signal changes from the gate-off voltage to the gate-on voltage, the capacitor CB reflects a change in a voltage of the output node to a voltage of the node QA and bootstraps the node QA.

In each stage, when the node QA is bootstrapped, the voltage of the node Q is different from the voltage of the node QA.

Each stage further includes a transistor T6 configured to block an electrical connection between the node Q and the node QA when the node QA is bootstrapped.

A gate electrode of the transistor T6 is connected to an input terminal of the gate-on voltage, a first electrode of the transistor T6 is connected to the node Q, and a second electrode of the transistor T6 is connected to the node QA.

The QB controller includes a capacitor CQ' connected between an input terminal of the clock signal and a node Q', a transistor T2 configured to supply the clock signal to the node QB in accordance with a voltage of the node Q', a transistor T3 configured to supply the gate-off voltage to the node Q' in response to the start signal, and a transistor T4 configured to supply the gate-off voltage to the node QB in accordance with the voltage of the node Q.

In each stage, the voltage of the node Q' changes in synchronization with the clock signal while the start signal is held at the gate-off voltage. The voltage of the node Q' is the gate-off voltage while the start signal is held at the gate-on voltage.

The transistor T8 includes transistors T8 and T8b that are connected in series to each other. A gate electrode of the transistor T8a is connected to the node QB, a first electrode of the transistor T8a is connected to the output node, and a second electrode of the transistor T8a is connected to a node Na. A gate electrode of the transistor T8b is connected to the node QB, a first electrode of the transistor T8b is connected to the node Na, and a second electrode of the transistor T8b is connected to an input terminal of the gate-off voltage.

Each stage further includes a transistor T5 configured to suppress a leakage current of the transistor T8. A gate electrode of the transistor T5 is connected to the output node, a first electrode of the transistor T5 is connected to an input terminal of the gate-on voltage, and a second electrode of the transistor T5 is connected to the node Na.

The clock signal in each stage includes a first clock signal which is applied through a first clock line and has a first phase, and a second clock signal which is applied through a second clock line and has a second phase different from the first phase. The first clock signal is input to odd-numbered stages of the plurality of stages, and the second clock signal is input to even-numbered stages of the plurality of stages.

A gate driver according to an embodiment of the disclosure includes a plurality of stages. Each stage includes a transistor T1 configured to apply a start signal of a gate-on voltage to a node Q in response to a first clock signal and activate the node Q, a transistor T7 configured to supply an emission signal of the gate-on voltage to an output node from when a node QA is bootstrapped in response to a second clock signal having a phase different from a phase of the first clock signal, a QB controller configured to activate a node QB as opposed to the node Q in response to the first clock signal, the start signal, and a voltage of the node Q, and a transistor T8 configured to supply the emission signal of a gate-off voltage to the output node while the node QB is activated prior to the node Q.

Each stage further includes a capacitor CB connected between the node QA and a node QA' and a transistor T9 switched in accordance with the node Q and configured to supply the second clock signal to the node QA'. When the second clock signal changes from the gate-off voltage to the gate-on voltage, the capacitor CB reflects a change in a voltage of the second clock signal to a voltage of the node QA and bootstraps the node QA.

In each stage, a voltage of the node QA' is the gate-off voltage while the voltage of the node Q is held at the gate-off voltage. The voltage of the node Q' is synchronized with the second clock signal while the voltage of the node Q is held at a voltage equal to or less than the gate-on voltage.

In each stage, when the node QA is bootstrapped, the voltage of the node Q is different from the voltage of the node QA.

Each stage further includes a transistor T6 configured to block an electrical connection between the node Q and the node QA when the node QA is bootstrapped.

A gate electrode of the transistor T6 is connected to an input terminal of the gate-on voltage, a first electrode of the transistor T6 is connected to the node Q, and a second electrode of the transistor T6 is connected to the node QA.

The QB controller includes a capacitor CQ' connected between an input terminal of the first clock signal and a node Q', a transistor T2 configured to supply the first clock signal to the node QB in accordance with a voltage of the node Q', a transistor T3 configured to supply the gate-off voltage to the node Q' in response to the start signal, and a transistor T4 configured to supply the gate-off voltage to the node QB in accordance with the voltage of the node Q.

In each stage, the voltage of the node Q' changes in synchronization with the first clock signal while the start signal is held at the gate-off voltage. The voltage of the node Q' is the gate-off voltage while the start signal is held at the gate-on voltage.

The transistor T8 includes transistors T8 and T8b that are connected in series to each other. A gate electrode of the transistor T8a is connected to the node QB, a first electrode of the transistor T8a is connected to the output node, and a second electrode of the transistor T8a is connected to a node Na. A gate electrode of the transistor T8b is connected to the node QB, a first electrode of the transistor T8b is connected to the node Na, and a second electrode of the transistor T8b is connected to an input terminal of the gate-off voltage.

Each stage further includes a transistor T5 configured to suppress a leakage current of the transistor T8. A gate electrode of the transistor T5 is connected to the output node, a first electrode of the transistor T5 is connected to an input terminal of the gate-on voltage, and a second electrode of the transistor T5 is connected to the node Na.

The plurality of stages include odd-numbered stages and even-numbered stages having both a first input terminal and a second input terminal. In the odd-numbered stages, the first clock signal is input to the first input terminal, and the second clock signal is input to the second input terminal. And, in the even-numbered stages, the first clock signal is input to the second input terminal, and the second clock signal is input to the first input terminal.

An electroluminescent display according to an embodiment of the disclosure includes a display panel including gate lines connected to pixels and a gate driver configured to generate an emission signal and supply the emission signal to the gate lines through the above-described plurality of stages according to embodiments of the disclosure.

Each pixel includes an organic light emitting diode, a driving thin film transistor configured to control a driving current flowing in the organic light emitting diode depending on a gate-to-source voltage, and an emission thin film transistor turned on or off in response to the emission signal and configured to determine an emission timing of the organic light emitting diode.

Although the embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gate driver comprising:
    a plurality of stages, each of the plurality of stages including:
        a first transistor configured to apply a start signal of a gate-on voltage to a first node in response to a first clock signal and activate the first node;
        a second transistor configured to supply an emission signal of the gate-on voltage to an output node when a second node is bootstrapped in response to a second clock signal, wherein the second clock signal has a phase different from a phase of the first clock signal;
        a first controller configured to activate a third node based on the first clock signal, the start signal and a voltage of the first node; and
        a third transistor configured to supply the emission signal of a gate-off voltage to the output node while the third node is activated prior to activation of the first node,
    wherein each of the plurality of stages further includes a fifth transistor configured to block an electrical connection between the first node and the second node when the second node is bootstrapped.

2. The gate driver of claim 1, wherein each of the plurality of stages further includes:
    a first capacitor connected between the second node and a fourth node; and a fourth transistor configured to switch in accordance with the first node and supply the second clock signal to the fourth node, wherein the first capacitor is configured to reflect a change in a voltage of the second clock signal to a voltage of the second node and bootstrap the second node, in response to the second clock signal changing from the gate-off voltage to the gate-on voltage.

3. The gate driver of claim 2, wherein a voltage of the fourth node is the gate-off voltage while a voltage of the first node is held at the gate-off voltage, and wherein a voltage of the fourth node is synchronized with the second clock signal while the voltage of the first node is held at a voltage less than or equal to the gate-on voltage.

4. The gate driver of claim 2, wherein when the second node is bootstrapped, a voltage of the first node is different from the voltage of the second node.

5. The gate driver of claim 1, wherein a gate electrode of the fifth transistor is connected to an input terminal of the gate-on voltage, a first electrode of the fifth transistor is connected to the first node, and a second electrode of the fifth transistor is connected to the second node.

6. The gate driver of claim 1, wherein the first controller includes:
   a second capacitor connected between an input terminal of the first clock signal and a fifth node;
   a sixth transistor configured to supply the first clock signal to the third node based on a voltage of the fifth node;
   a seventh transistor configured to supply the gate-off voltage to the fifth node in response to the start signal; and
   an eight configured to supply the gate-off voltage to the third node based on the voltage of the first node.

7. The gate driver of claim 6, wherein the voltage of the fifth node changes in synchronization with the first clock signal while the start signal is held at the gate-off voltage, and wherein the voltage of the fifth node is the gate-off voltage while the start signal is held at the gate-on voltage.

8. The gate driver of claim 1, wherein the third transistor includes a ninth transistor and a tenth transistor, wherein the ninth transistor is connected in series with the tenth transistor, wherein a gate electrode of the ninth transistor is connected to the third node, a first electrode of the ninth transistor is connected to the output node, and a second electrode of the ninth transistor is connected to a sixth node between the ninth transistor and tenth transistor, and wherein a gate electrode of the tenth transistor is connected to the third node, a first electrode of the tenth transistor is connected to the sixth node, and a second electrode of the tenth transistor is connected to an input terminal of the gate-off voltage.

9. The gate driver of claim 8, wherein each of the plurality of stages further includes an eleventh transistor configured to suppress a leakage current of the third transistor, and wherein a gate electrode of the eleventh transistor is connected to the output node, a first electrode of the eleventh transistor is connected to an input terminal of the gate-on voltage, and a second electrode of the eleventh transistor is connected to the sixth node.

10. The gate driver of claim 1, wherein the plurality of stages include odd-numbered stages and even-numbered stages, and each of the odd-numbered stages and the even-numbered stages include a first input terminal and a second input terminal, wherein in each of the odd-numbered stages, the first clock signal is input to the first input terminal, and the second clock signal is input to the second input terminal, and wherein in each of the even-numbered stages, the first clock signal is input to the second input terminal, and the second clock signal is input to the first input terminal.

* * * * *